US011056397B2

(12) United States Patent
Guler et al.

(10) Patent No.: US 11,056,397 B2
(45) Date of Patent: Jul. 6, 2021

(54) DIRECTIONAL SPACER REMOVAL FOR INTEGRATED CIRCUIT STRUCTURES

(71) Applicant: Intel Corporation, Santa Clara, CA (US)

(72) Inventors: Leonard P. Guler, Hillsboro, OR (US); Elliot Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/635,265

(22) PCT Filed: Sep. 26, 2017

(86) PCT No.: PCT/US2017/053358
§ 371 (c)(1),
(2) Date: Jan. 30, 2020

(87) PCT Pub. No.: WO2019/066768
PCT Pub. Date: Apr. 4, 2019

(65) Prior Publication Data
US 2020/0373205 A1   Nov. 26, 2020

(51) Int. Cl.
*H01L 27/088* (2006.01)
*H01L 21/8234* (2006.01)
(Continued)

(52) U.S. Cl.
CPC ............ *H01L 21/823468* (2013.01); *H01L 21/823431* (2013.01); *H01L 27/0886* (2013.01);
(Continued)

(58) Field of Classification Search
CPC .......... H01L 21/762; H01L 21/823431; H01L 21/823468; H01L 21/823481;
(Continued)

(56) References Cited

U.S. PATENT DOCUMENTS 9,755,019 B1 * 9/2017 Fung ................. H01L 29/41791
10,510,608 B2 * 12/2019 Deng ............. H01L 21/823481
(Continued)

FOREIGN PATENT DOCUMENTS

| JP | 2008060219 A | 3/2008 |
| WO | 2018004680 A1 | 1/2018 |
| WO | 2019066768 A1 | 4/2019 |

OTHER PUBLICATIONS

International Preliminary Report on Patentability in International Application No. PCT/US2017/053358 dated Apr. 9, 2020, 8 pages.
(Continued)

*Primary Examiner* — Stephen W Smoot
(74) *Attorney, Agent, or Firm* — Patent Capital Group

(57) ABSTRACT

Disclosed herein are techniques for directional spacer removal, as well as related integrated circuit (IC) structures and devices. For example, in some embodiments, an IC structure may include: a first semiconductor fin having a first fin end cap; a second semiconductor fin having a second fin end cap, wherein the second fin end cap faces the first fin end cap; a first gate over the first semiconductor fin, wherein the first gate has a first gate end cap; a second gate over the second semiconductor fin, wherein the second gate has a second gate end cap facing the first gate end cap; and a gate edge isolation material adjacent to the first fin end cap, the second fin end cap, the first gate end cap, and the second gate end cap.

19 Claims, 21 Drawing Sheets

(51) Int. Cl.
  *H01L 29/78* (2006.01)
  *H01L 29/66* (2006.01)
  *H01L 21/84* (2006.01)
(52) U.S. Cl.
  CPC ...... *H01L 29/66795* (2013.01); *H01L 29/785* (2013.01); *H01L 21/84* (2013.01)
(58) Field of Classification Search
  CPC ............. H01L 27/0886; H01L 29/0653; H01L 29/1037; H01L 29/41791; H01L 29/42376; H01L 29/4238; H01L 29/6656; H01L 29/66795; H01L 29/785; H01L 29/7851; H01L 29/7856
  See application file for complete search history.

(56) References Cited

U.S. PATENT DOCUMENTS

| | | | |
|---|---|---|---|
| 2009/0026523 A1* | 1/2009 | Wong | H01L 21/845 257/316 |
| 2011/0095372 A1* | 4/2011 | Yuan | H01L 21/76224 257/368 |
| 2011/0291166 A1 | 12/2011 | Booth, Jr. et al. | |
| 2011/0298025 A1 | 12/2011 | Haensch et al. | |
| 2012/0168833 A1 | 7/2012 | Bonser et al. | |
| 2013/0221448 A1* | 8/2013 | Chang | H01L 29/66795 257/401 |
| 2016/0005735 A1* | 1/2016 | Costrini | H01L 21/76224 257/401 |
| 2017/0213821 A1 | 7/2017 | Or-Bach et al. | |
| 2017/0213824 A1 | 7/2017 | Cheng et al. | |
| 2018/0040617 A1* | 2/2018 | Su | H01L 21/823431 |
| 2018/0182668 A1* | 6/2018 | Xie | H01L 29/6653 |

OTHER PUBLICATIONS

International Search Report and Written Opinion in International Patent Application No. PCT/US2017/053358 dated Jun. 25, 2018, 9 pages.

* cited by examiner

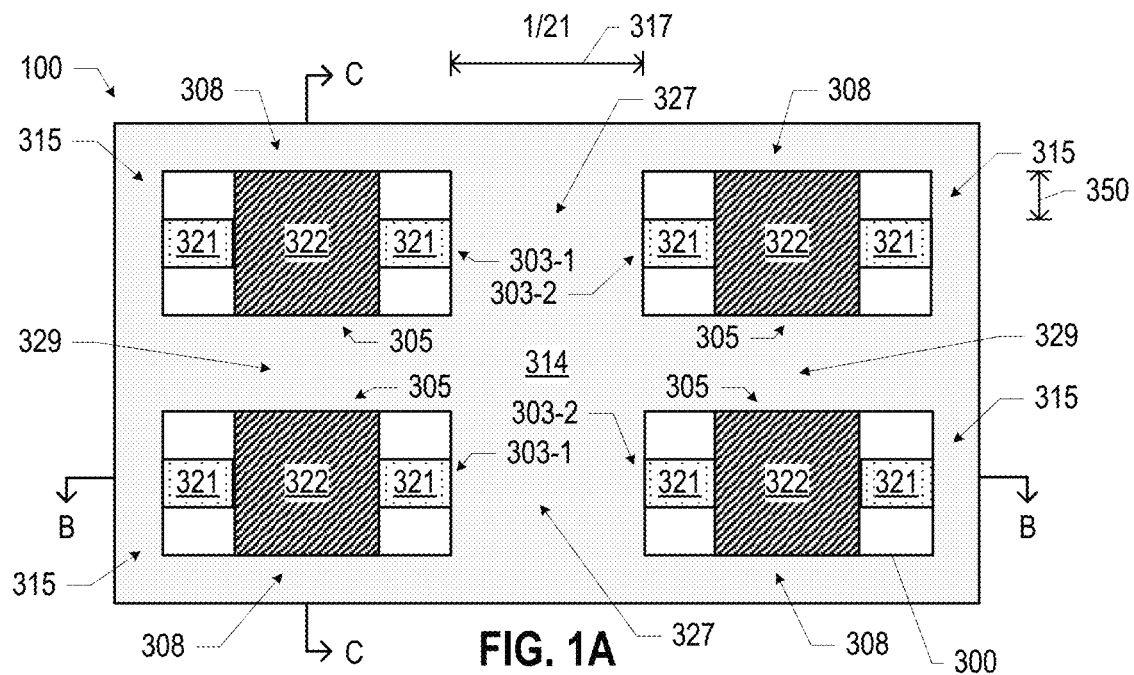
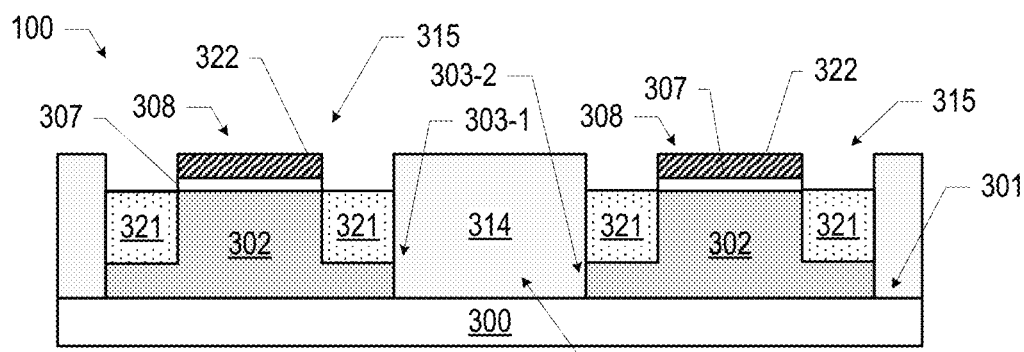
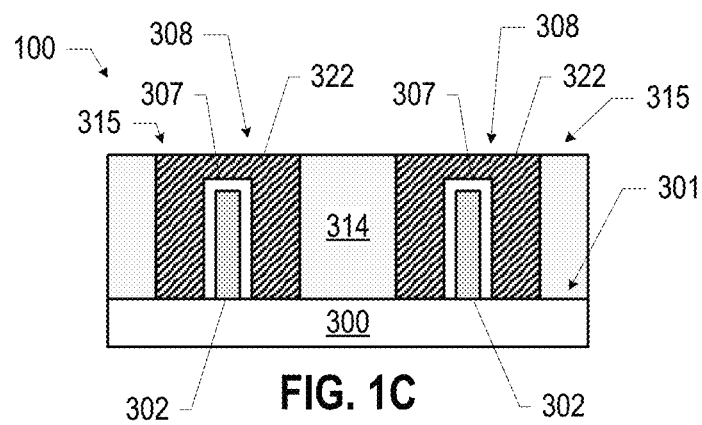

DIRECTIONAL SPACER REMOVAL FOR INTEGRATED CIRCUIT STRUCTURES

CROSS-REFERENCE TO RELATED APPLICATION

This application is a national stage application under 35 U.S.C. § 371 of PCT International Application Serial No. PCT/US2017/053358, filed on Sep. 26, 2017 and entitled "DIRECTIONAL SPACER REMOVAL FOR INTEGRATED CIRCUIT STRUCTURES," which is hereby incorporated by reference herein in its entirety.

BACKGROUND

Sidewall spacers are used in some integrated circuits (ICs) to provide a non-conductive barrier between adjacent elements. Some sidewall spacers may be formed by conformally depositing a spacer material, then etching the spacer material "downwards" to remove the spacer material on horizontal surfaces while leaving spacer material on vertical, sidewall surfaces.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A-1C are various views of an integrated circuit (IC) structure, in accordance with various embodiments.

DETAILED DESCRIPTION

Disclosed herein are techniques for directional spacer removal, as well as related integrated circuit (IC) structures and devices. For example, in some embodiments, an IC structure may include: a first semiconductor fin having a first fin end cap; a second semiconductor fin having a second fin end cap, wherein the second fin end cap faces the first fin end cap; a first gate over the first semiconductor fin, wherein the first gate has a first gate end cap; a second gate over the second semiconductor fin, wherein the second gate has a second gate end cap facing the first gate end cap; and a gate edge isolation material adjacent to the first fin end cap, the second fin end cap, the first gate end cap, and the second gate end cap.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

Figure 2A:
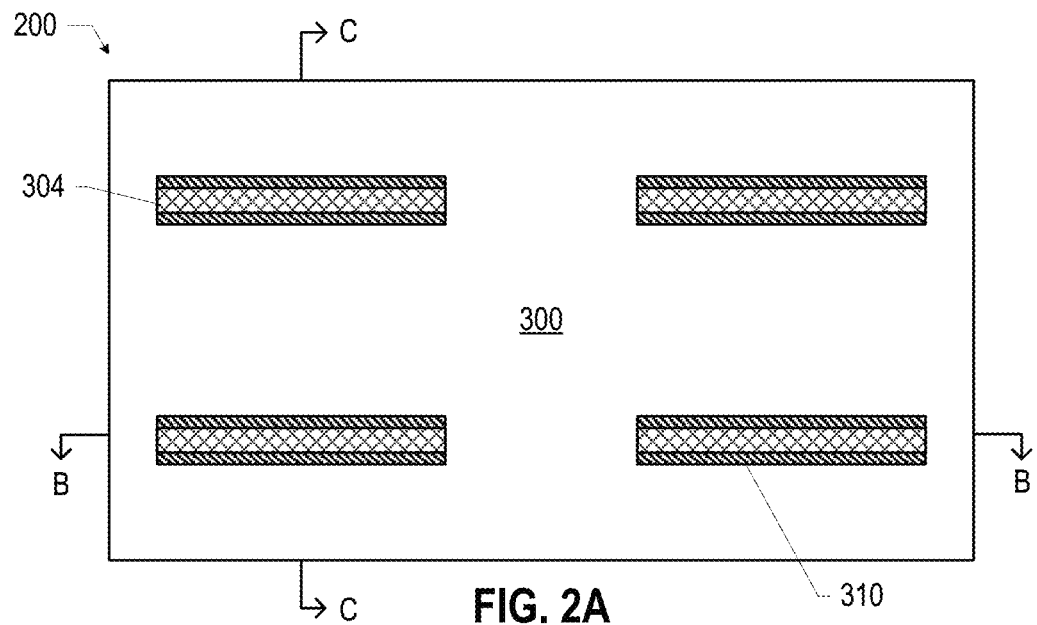
FIGS. 2A-2C, 3A-3C, 4A-4C, 5A-5C, 6A-6C, 7A-7C, 8A-8C, 9A-9C, 10A-10C, 11A-11C, 12A-12C, 13A-13C, 14A-14C, 15A-15C, 16A-16C, and 17A-17C illustrate stages in an example process of manufacturing the IC structure of FIG. 1, in accordance with various embodiments.
Figure 2B:
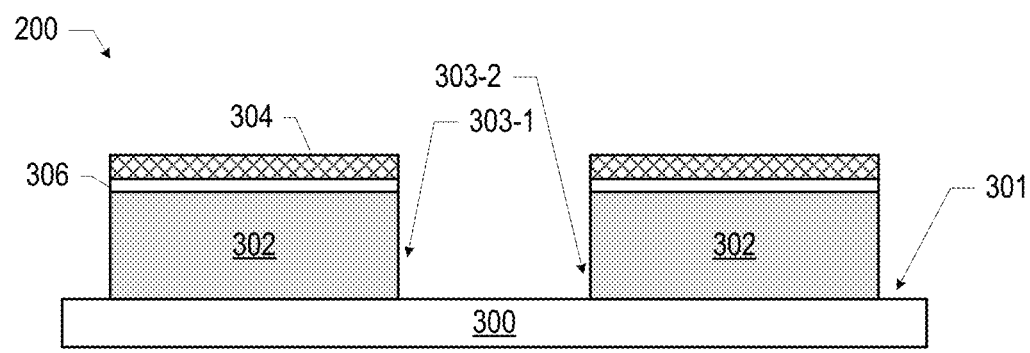
Figure 2C:
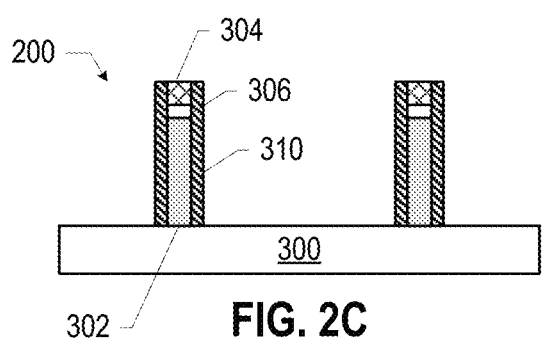

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, two elements are "adjacent" when they are at least partially in contact. When used to describe a range of dimensions, the phrase "between X and Y" represents a range that includes X and Y. For convenience, the phrase "FIG. 1" may be used to refer to the collection of drawings of FIGS. 1A-1C, the phrase "FIG. 2" may be used to refer to the collection of drawings of FIGS. 2A-2C, etc.

FIG. 1 illustrates an IC structure 100, in accordance with various embodiments. In particular, FIG. 1A is a top view of the IC structure 100, FIG. 1B is a side cross-sectional view through the section B-B of FIG. 1A, and FIG. 1C is a side cross-sectional view through the section C-C of FIG. 1A.

The IC structure 100 may include multiple fins 302. In particular, the portion of the IC structure 100 depicted in FIG. 1 includes four fins 302 arranged in a two-by-two array. In some embodiments, the four fins 302 illustrated in FIG. 1 may be part of a larger array (not shown) of fins 302, and may be located in an interior of this larger array of fins 302. The fins 302 of an IC structure 100 need not be arranged in a regular array.

The fins 302 may extend from a surface 301 of a base 300. In some embodiments, the base 300 may be a bulk semiconductor substrate, while in other embodiments the base 300 may be a silicon-on-insulator (SOI) substrate. The base 300 may also include a shallow trench isolation (STI) material, not depicted in FIG. 1 but discussed below with reference to FIG. 18.

Each of the fins 302 may have two fin end caps 303. When two fins 302 are longitudinally aligned and adjacent, the space between the "rightmost" fin end cap 303 of the "left" fin 302 and the "leftmost" fin end cap 303 of the "right" fin 302 (using the orientation of FIGS. 1A and 1B) may be referred to herein as a fin end gap 327; two fin end gaps 327 are illustrated in FIG. 1. For ease of discussion herein, the fin end cap 303 defining the "left" side of a fin end gap 327 may be referred to herein as the "left fin end cap 303-1," and the fin end cap 303 defining the "right" side of a fin end gap 327 may be referred to herein as the "right end 303-2" (again, using the orientation of FIGS. 1A and 1B). The terms "right" and "left" are used herein purely for clarity of illustration with reference to the drawings. The left fin end cap 303-1 and the right fin end cap 303-2 defining a fin end gap 327 may be referred to as "facing" each other. In some embodiments, the width 317 of a fin end gap 327 may be between 25 nanometers and 75 nanometers (e.g., between 40 nanometers and 50 nanometers).

The fins 302 may be part of transistors 315; in the particular embodiment illustrated in FIG. 1, each fin 302 may be part of an associated transistor 315. A transistor 315 may include source and/or drain (S/D) regions 321 and a gate 308 to control current flow in the transistor 315 through a channel between the S/D regions 321. In the IC structure 100 of FIG. 1, S/D regions 321 may be proximate to the fin end caps 303 of each fin 302, on opposite sides of the gate 308 along the length of the fin 302. The area of the fin 302 between the S/D regions 321 and under the gate 308 may provide the channel of the associated transistor 315. The IC structure 100 may also include one or more S/D contacts and one or more gate contacts (not shown) to route electrical signals to/from the S/D regions 321 and the gate 308, respectively. As used herein, the S/D regions 321 may be considered part of the associated fin 302.

Each transistor 315 may include a gate 308 formed of at least two layers, a gate dielectric 307 and a gate electrode 322. The gate dielectric 307 may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode 322 may be formed on the gate dielectric 307 and may include at least one p-type work function metal or n-type work function metal, depending on whether the transistor 315 is to be a p-type metal oxide semiconductor (PMOS) or an n-type metal oxide semiconductor (NMOS) transistor. In some implementations, the gate electrode 322 may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode 322 include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode 322 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

Each gate 308 may each have two gate end caps 305, defining the lateral extent of the gate 308 (e.g., the extent of the gate electrode 322 perpendicular to the longitudinal axis of the associated fin 302). When two transistors 315 are laterally aligned and adjacent, the space between the proximate gate end caps 305 of the two transistors 315 may be referred to herein as the gate end gap 329; two gate end gaps 329 are illustrated in FIG. 1.

The S/D regions 321 may be formed within the fin 302 adjacent to the gate 308 of each transistor 315. The S/D regions 321 may serve as a source/sink for carriers during operation of the transistors 315, and may have an n-type conductivity or a p-type conductivity. The S/D regions 321 may have a uniform doping concentration or may include sub-regions of different concentrations or dopant profiles. In some embodiments, the two S/D regions 321 in a fin 302 may have the same doping concentration profile; in other embodiments, the doping concentration profiles of the S/D regions 321 in a fin 302 may differ from each other. In some embodiments, the S/D regions 321 may be formed using one or more alternate semiconductor materials such as germanium or a group III-V material or alloy. In further embodiments, one or more layers of metal and/or metal alloys may be used to form the S/D regions 321.

In the embodiment of FIG. 1, a gate edge isolation material 314 may be disposed in the gate end gaps 329. In particular, the gate edge isolation material 314 may be adjacent to the facing gate end caps 305 that define a gate end gap 329. The gate edge isolation material 314 may include one or more dielectric materials, and may provide an electrical barrier between the proximate gates 308. The gate edge isolation material 314 may thus isolate transistors 315 formed on either side of a gate end gap 329. The gate edge isolation material 314 may include any one or more dielectric materials. Although the singular term "material" may be used to refer to the gate edge isolation material 314, the gate edge isolation material 314 may include multiple dielectric materials (e.g., as discussed below with reference to FIG. 19).

The gate edge isolation material 314 may also be disposed in the fin end gaps 327. The gate edge isolation material 314 may thus also isolate transistors 315 formed on fins 302 that are longitudinally aligned and adjacent. In some embodiments, the gate edge isolation material 314 in a fin end gap 327 may be adjacent to the fin end caps 303-1 and 303-2 defining the associated fin end gap 327.

The IC structure 100 of FIG. 1 may be manufactured using any suitable technique. For example, FIGS. 2-17 illustrate various stages in an example process of manufacturing the IC structure 100 of FIG. 1. In FIGS. 2-17, the "A," "B" and "C" sub-figures share the perspectives of FIGS. 1A, 1B, and 1C, respectively.

FIG. 2 illustrates an assembly 200 including fins 302 extending from a base 300. The base 300 may take any of the forms disclosed herein (e.g. with reference to FIGS. 1 and 18). A pad oxide layer 306 may be disposed on the top of the fins 302, and a hardmask layer 304 may be disposed on the pad oxide layer 306. The hardmask layer 304 may have been used to pattern the pad oxide layer 306 and the fins 302. In some embodiments, the pad oxide layer 306 may include silicon oxide. In some embodiments, the hardmask layer 304 may include silicon nitride. A layer of dielectric material 310 may be disposed on side faces of the fins 302, and may extend up to the side faces of the pad oxide layer 306 and the hardmask layer 304. In some embodiments, the dielectric material 310 may be a dummy dielectric material that may be removed at later processing stages and replaced with a "permanent" gate dielectric (as discussed below), while in other embodiments, the dielectric material 310 may itself be a permanent gate dielectric (e.g., the gate dielectric 307 discussed above).

Figure 3A:
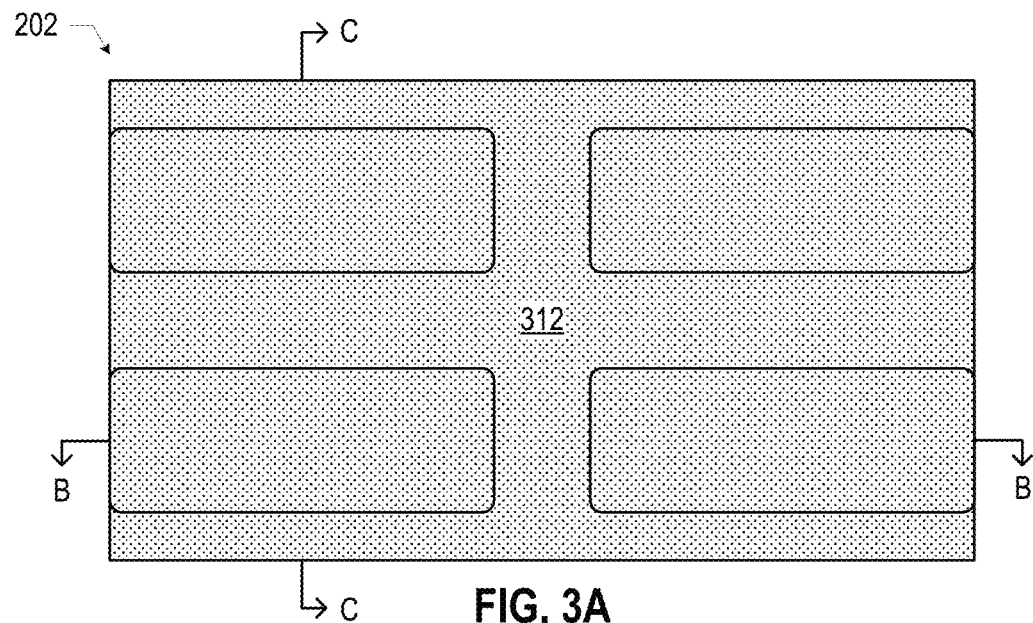
Figure 3B:
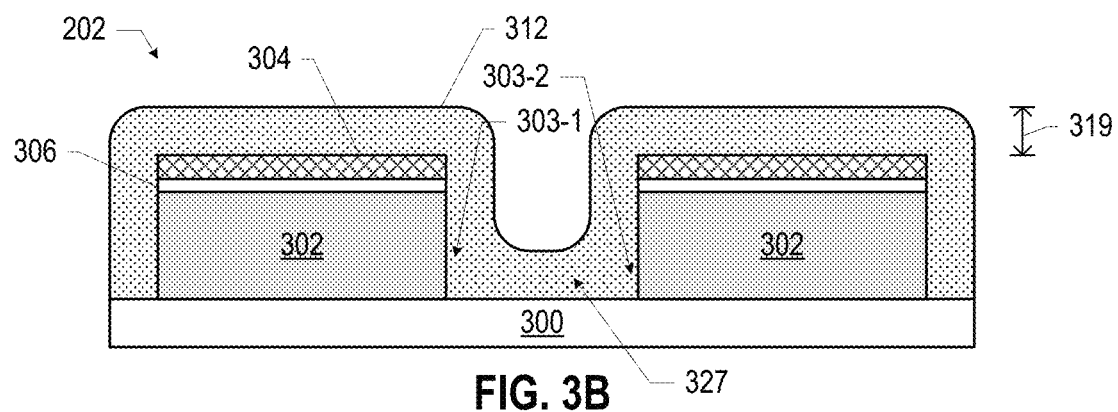
Figure 3C:
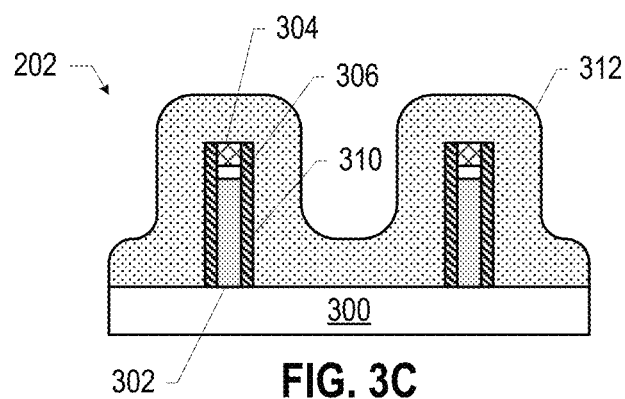

FIG. 3 illustrates an assembly 202 subsequent to conformally depositing a spacer material 312 on the assembly 200 (FIG. 2). In some embodiments, an atomic layer deposition technique may be used to deposit the spacer material 312. The thickness 319 of the spacer material 312 may take any suitable value; for example, in some embodiments, the spacer material 312 may be deposited to a thickness 319 between 10 nanometers and 20 nanometers (e.g., between 10 nanometers and 15 nanometers). As illustrated in FIG. 3, the spacer material 312 may be proximate to the side faces of the fins 302 and the fin end caps 303 of the fins 302. The spacer material 312 may be a dielectric material, and may have any suitable material composition, such as silicon oxide, silicon nitride, silicon oxynitride, or combinations thereof.

Figure 4A:
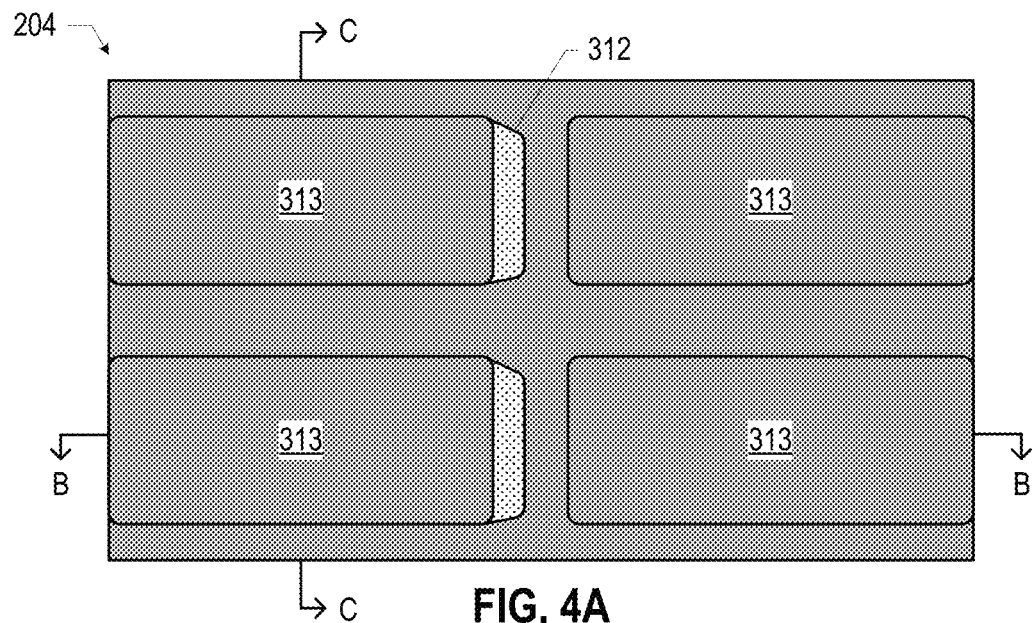
Figure 4B:
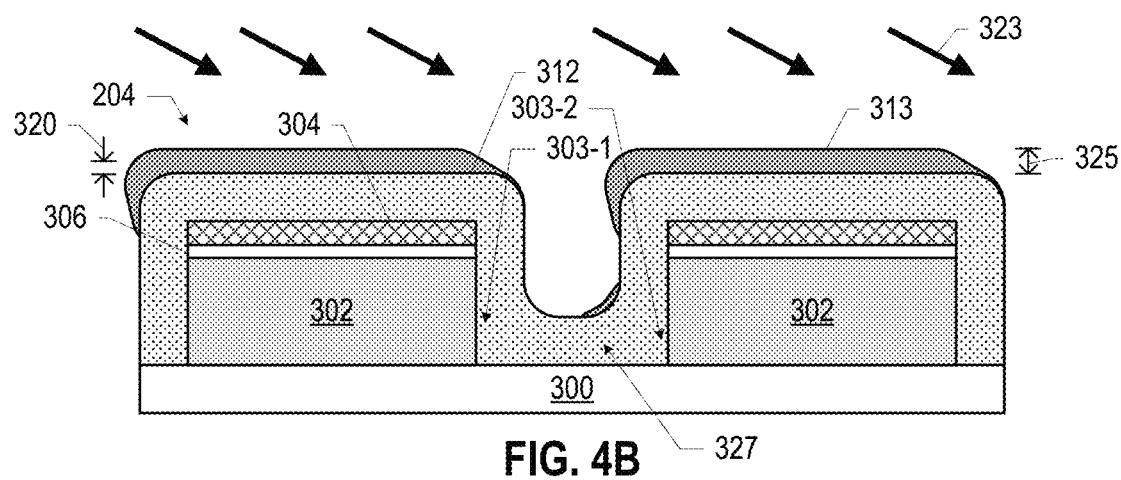
Figure 4C:
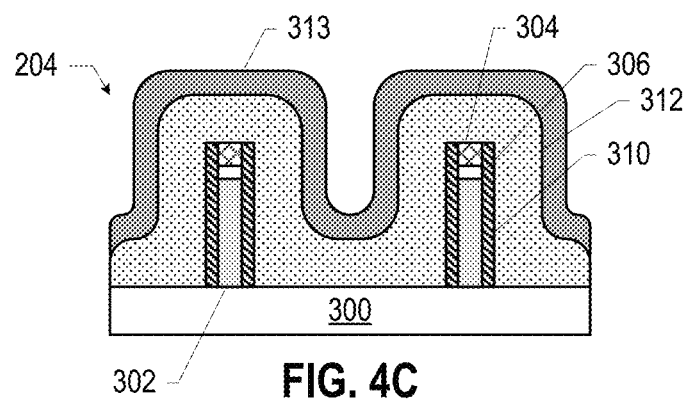

FIG. 4 illustrates an assembly 204 subsequent to depositing a protective material 313 on the assembly 202 (FIG. 3) at an angle relative to the surface 301 of the base 300, as indicated by the arrows 323. The angle of deposition may be selected so that the protective material 313 deposits more thickly on the spacer material 312 proximate to the right fin end cap 303-2 than on spacer material 312 proximate to the left fin end cap 303-1 of a fin end gap 327. For example, in some embodiments, the thickness 325 of the protective material 313 proximate to the right fin end cap 303-2 may be between 10 nanometers and 15 nanometers (e.g., 12 nanometers), while the thickness 320 of the protective material 313 proximate to the left fin end cap 303-1 may be between 0 nanometers and 10 nanometers (e.g., between 3 nanometers and 7 nanometers). In some embodiments, some of the protective material 313 may be deposited in the fin end gaps 327 (as indicated in FIG. 4), the amount of which may depend at least in part on the angle of deposition. As illustrated in FIG. 4C, the thickness of the protective material 313 may be substantially uniform in cross-sections perpendicular to the longitudinal axes of the fins 302. Any suitable technique may be used to deposit the protective material 313; for example, in some embodiments, the protective material 313 may be sputtered onto the assembly 202 using a sputtering tool that allows for angular deposition. The protective material 313 may have any suitable composition. For example, in some embodiments, the protective material 313 may include titanium, silicon, titanium nitride, silicon oxide, or any suitable sputtered material.

Figure 5A:
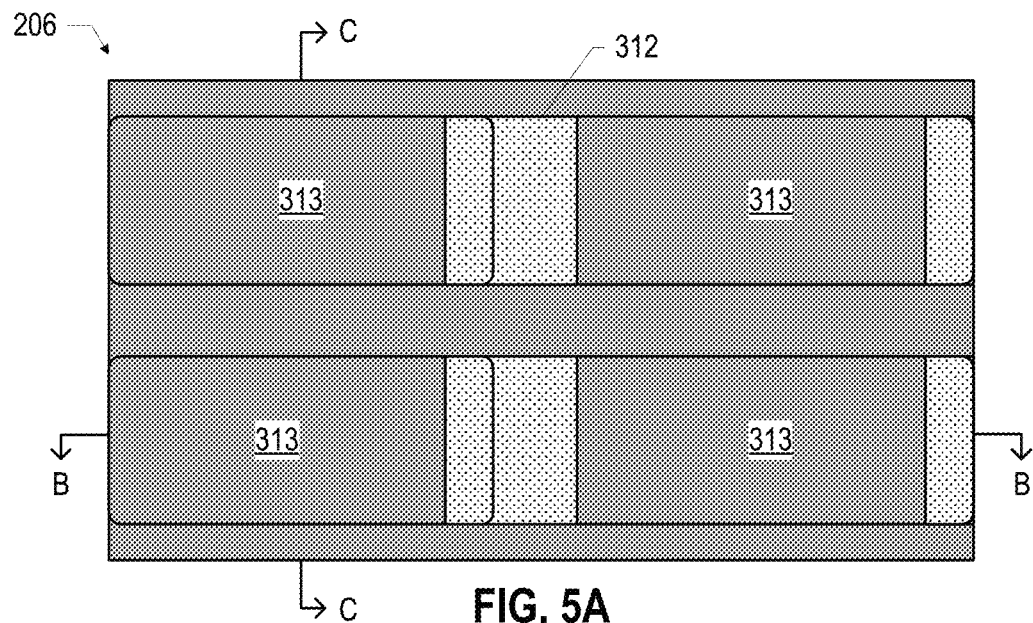
Figure 5B:
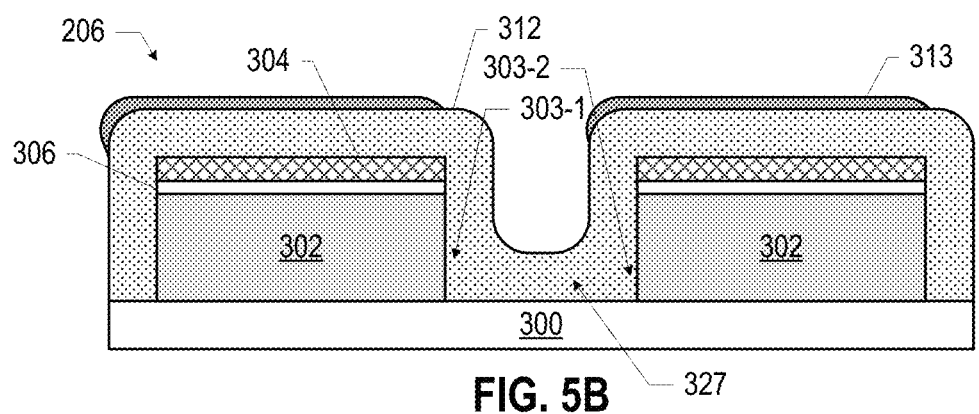
Figure 5C:
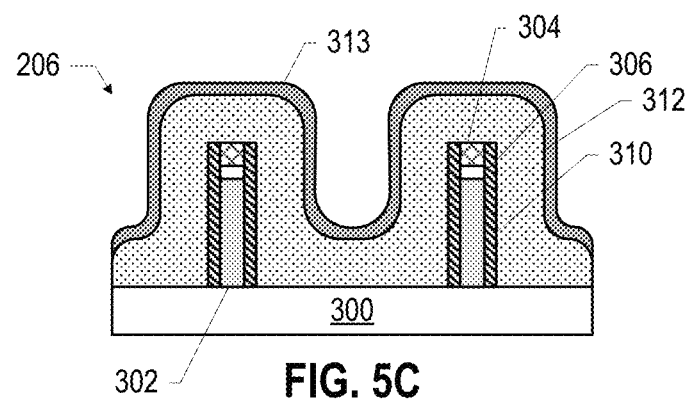

FIG. 5 illustrates an assembly 206 subsequent to recessing the protective material 313 of the assembly 204 (FIG. 4). The recessing of the protective material 313 may be performed using any suitable technique, such as a wet etch that removes the protective material 313 in a "downward" direction. The amount of recessing performed may be selected so as to substantially remove the protective material 313 on the spacer material 312 proximate to the left fin end caps 303-1 of the fin end gaps 327, while leaving enough protective material 313 to still substantially cover the spacer material 312 proximate to the right fin end caps 303-2 of the fin end gaps 327. In some embodiments, the protective material 313 may be recessed by an amount between 2 nanometers and 10 nanometers (e.g., between 4 nanometers and 8 nanometers).

Figure 6A:
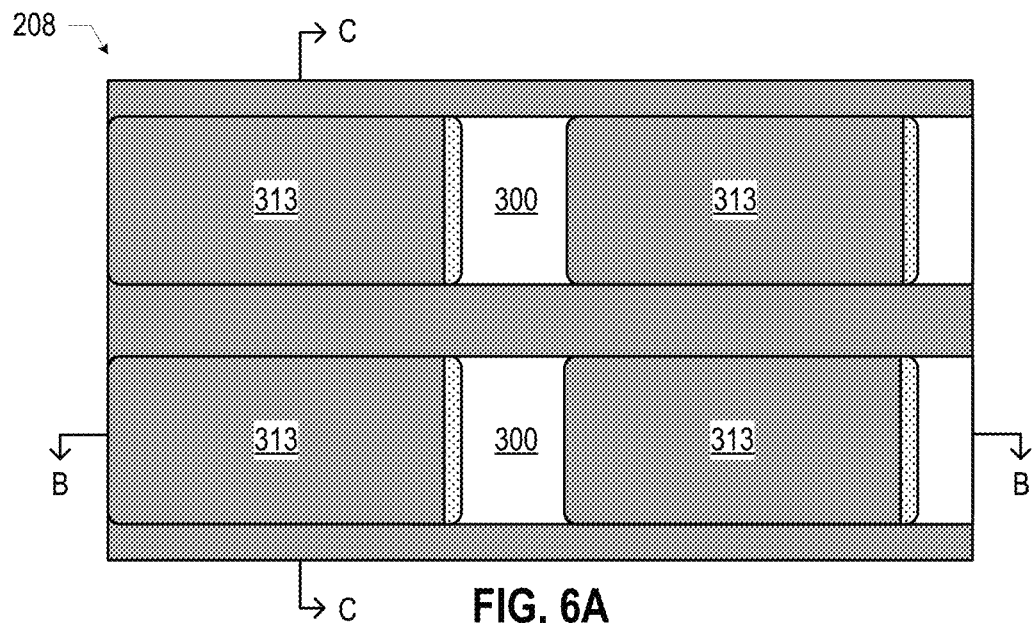
Figure 6B:
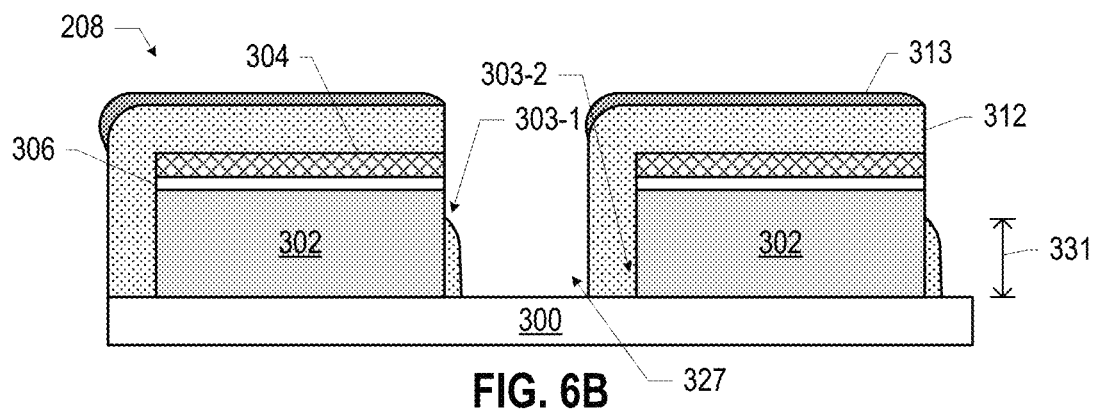
Figure 6C:
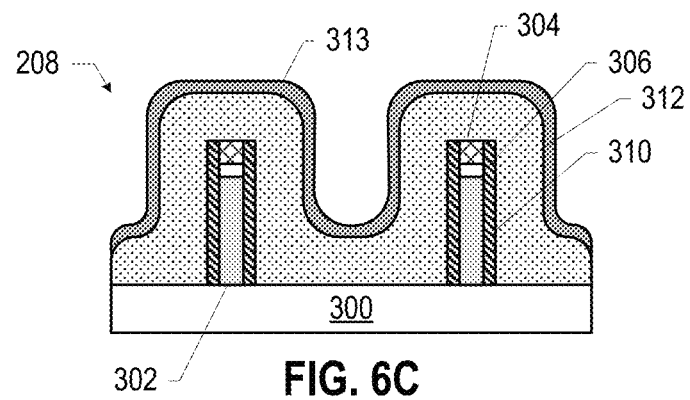

FIG. 6 illustrates an assembly 208 subsequent to "downwardly" etching the spacer material 312 of the assembly 206 (FIG. 5). The protective material 313 may block etching of any spacer material 312 under the protective material 313, and thus only the "exposed" spacer material 312 may be etched. Because the spacer material 312 proximate to the left fin end caps 303-1 of the fin end gaps 327 were exposed in the assembly 206 (and the spacer material 312 proximate to the right fin end caps 303-2 were not exposed), the etch may substantially remove the spacer material 312 proximate to the left fin end caps 303-1 while leaving the spacer material 312 proximate to the right fin end caps 303-2. In some embodiments, all of the spacer material 312 proximate to the left fin end caps 303-1 may be removed by the etch, while in other embodiments, some amount of the spacer material 312 may remain proximate to the left fin end caps 303-1 (e.g., as indicated in FIG. 6). For example, in some embodiments, the amount of spacer material 312 remaining on the left fin end caps 303-1 may have a height 331 between 0 nanometers and 50 nanometers. Any suitable technique may be used to etch the exposed spacer material 312, such as an appropriate directional selective etch.

Figure 7A:
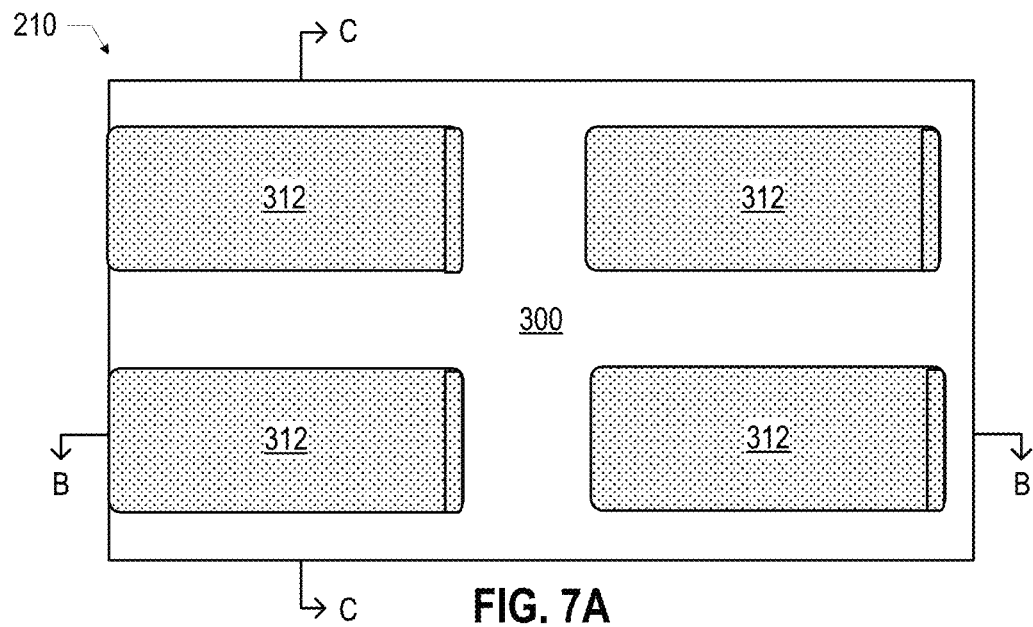
Figure 7B:
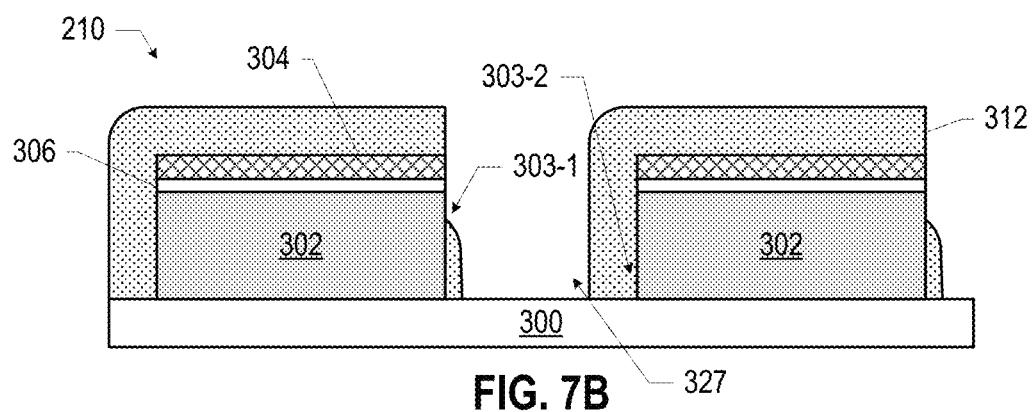
Figure 7C:
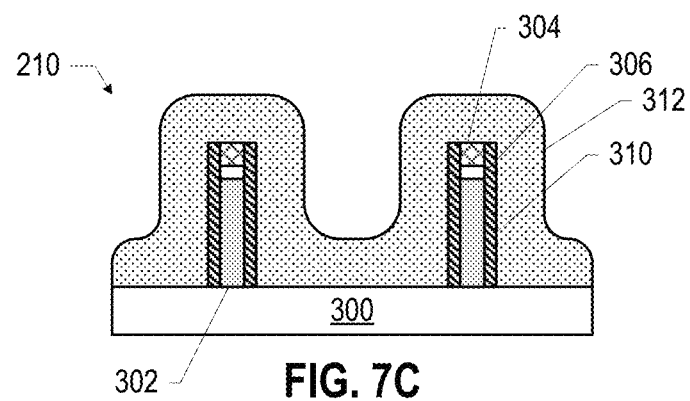

FIG. 7 illustrates an assembly 210 subsequent to removing the protective material 313 from the assembly 208 (FIG. 6). Any suitable technique may be used to remove the protective material 313, such as an appropriate selective etch.

Figure 8A:
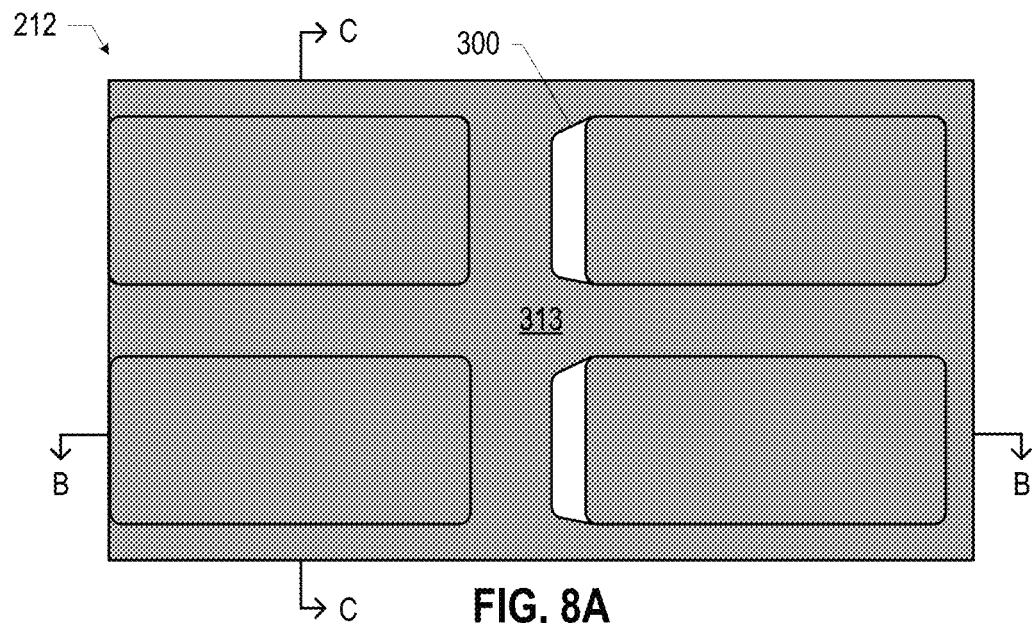
Figure 8B:
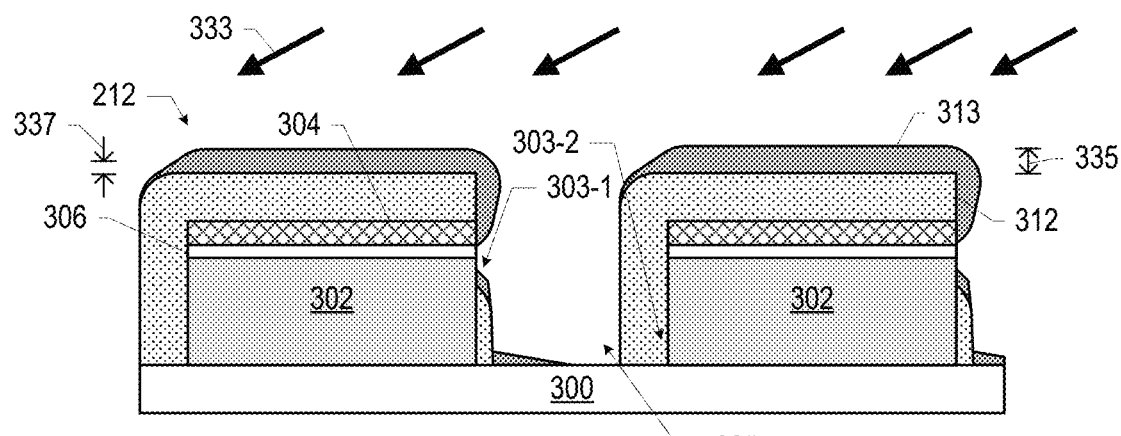
Figure 8C:
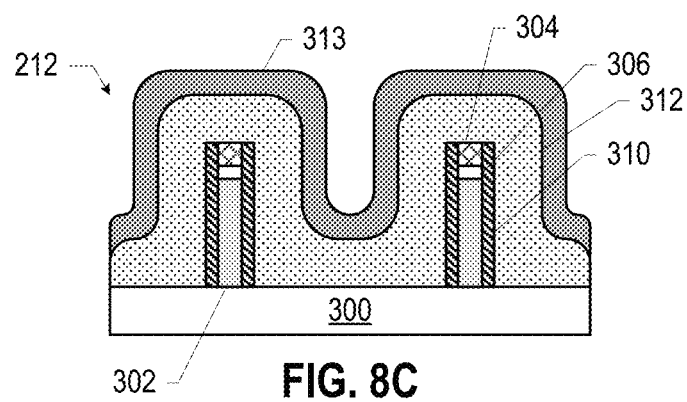

FIG. 8 illustrates an assembly 212 subsequent to depositing additional protective material 313 on the assembly 210 (FIG. 7) at an angle relative to the surface 301 of the base 300, as indicated by the arrows 333. The angle of deposition for the additional protective material 313 may be selected so that the additional protective material 313 deposits more thickly on the spacer material 312 proximate to the left fin end cap 303-1 than on the spacer material 312 proximate to the right fin end cap 303-2 of a fin end gap 327. The deposition of the additional protective material 313 may thus be "complementary" to the deposition of the protective material 313 in the assembly 204 (FIG. 4). In some embodiments, the thickness 335 of the protective material 313 proximate to the left fin end cap 303-1 may be between 10 nanometers and 15 nanometers (e.g., 12 nanometers), while the thickness 337 of the protective material 313 proximate to the right fin end cap 303-2 may be between 0 nanometers and 10 nanometers (e.g., between 3 nanometers and 7 nanometers). As noted above with reference to FIG. 4, and as indicated in FIG. 8, in some embodiments, some of the additional protective material 313 may be deposited in the fin end gaps 327, the amount of which may depend at least in part on the angle of deposition. As illustrated in FIG. 8C, the thickness of the additional protective material 313 may be substantially uniform in cross-sections perpendicular to the longitudinal axes of the fins 302. Any suitable deposition technique and material composition for the additional protective material 313 may be used, such as any of the embodiments discussed above with reference to FIG. 4.

Figure 9A:
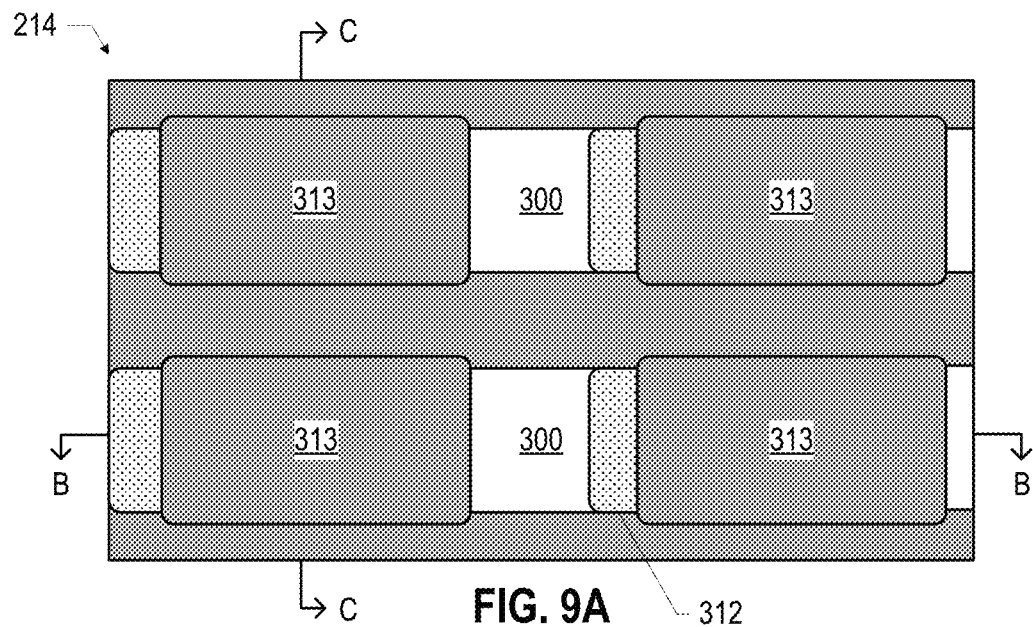
Figure 9B:
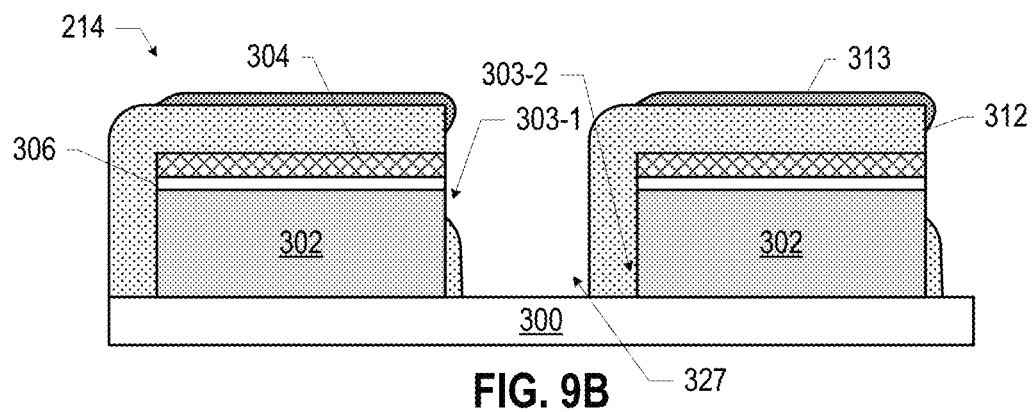
Figure 9C:
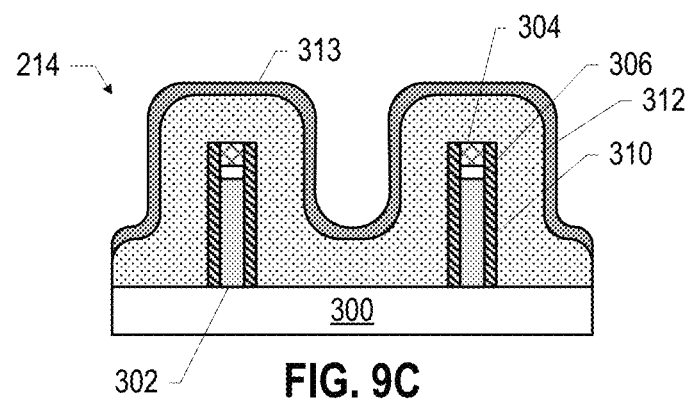

FIG. 9 illustrates an assembly 214 subsequent to recessing the additional protective material 313 of the assembly 212

(FIG. 8). The recessing of the additional protective material 313 may be performed using any suitable technique, and may remove any desired thickness of additional protective material 313 (e.g., in accordance with any of the embodiments discussed above with reference to FIG. 5). The amount of recessing performed may be selected so as to substantially remove the protective material 313 on the spacer material 312 proximate to the right fin end caps 303-2 of the fin end gaps 327, while leaving enough protective material 313 to still substantially cover the spacer material 312 on other surfaces of the assembly 212.

Figure 10A:
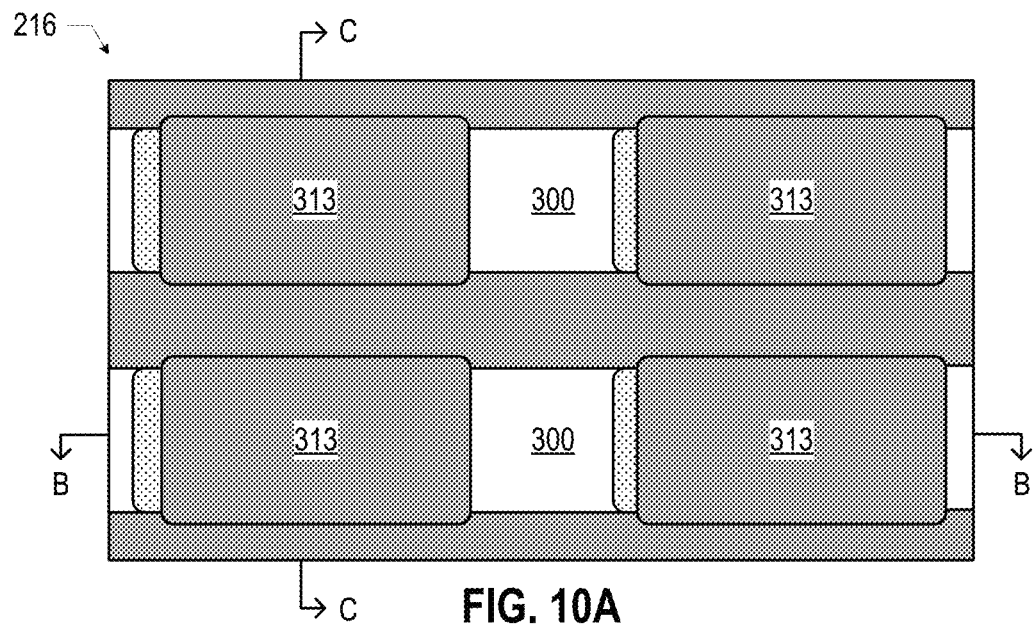
Figure 10B:
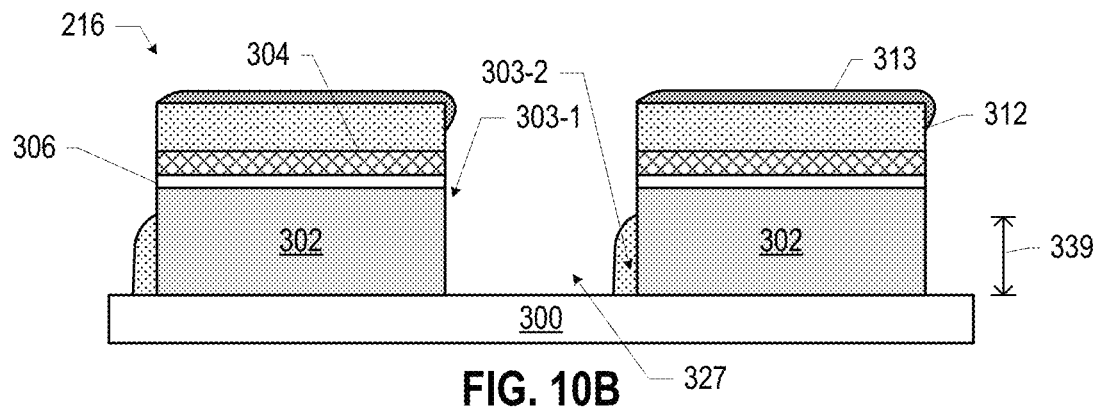
Figure 10C:
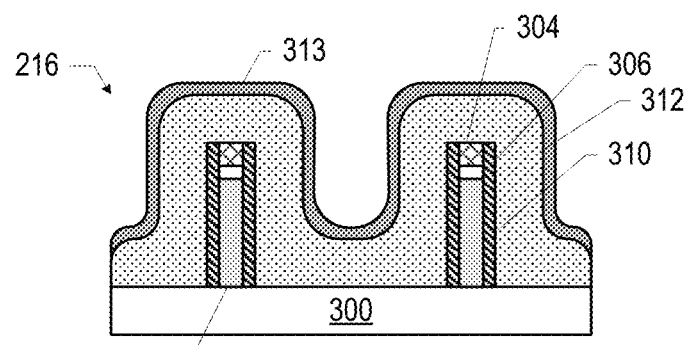

FIG. 10 illustrates an assembly 216 subsequent to "downwardly" etching the spacer material 312 of the assembly 214 (FIG. 9). As discussed above with reference to FIG. 6, the additional protective material 313 may block etching of any spacer material 312 under the additional protective material 313, and thus only the "exposed" spacer material 312 may be etched. Because the spacer material 312 proximate to the right fin end caps 303-2 of the fin end gaps 327 were exposed in the assembly 214, the etch may substantially remove the spacer material 312 proximate to the right fin end caps 303-2 while leaving other portions of the spacer material 312 in place. In some embodiments, all of the spacer material 312 proximate to the right fin end caps 303-2 may be removed by the etch, while in other embodiments, some amount of the spacer material 312 may remain proximate to the right fin end caps 303-2 (e.g., as indicated in FIG. 10). For example, in some embodiments, the amount of spacer material 312 remaining on the right fin end caps 303-2 may have a height 339 between 0 nanometers and 50 nanometers. Any suitable technique may be used to etch the exposed spacer material 312, such as an appropriate directional selective etch.

Figure 11A:
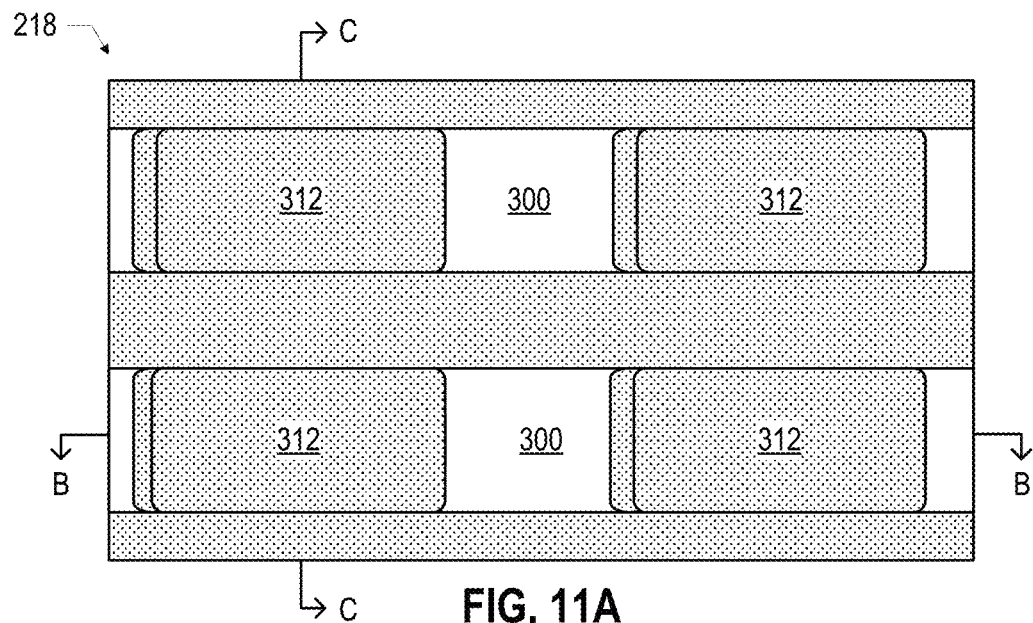
Figure 11B:
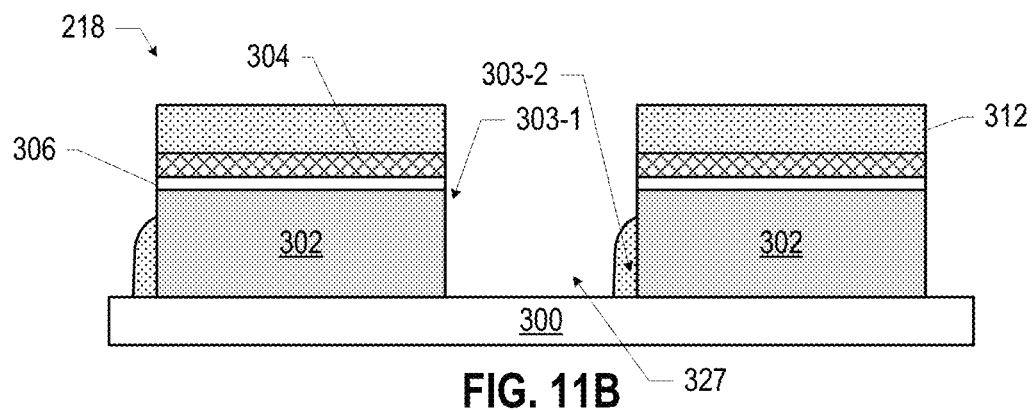
Figure 11C:
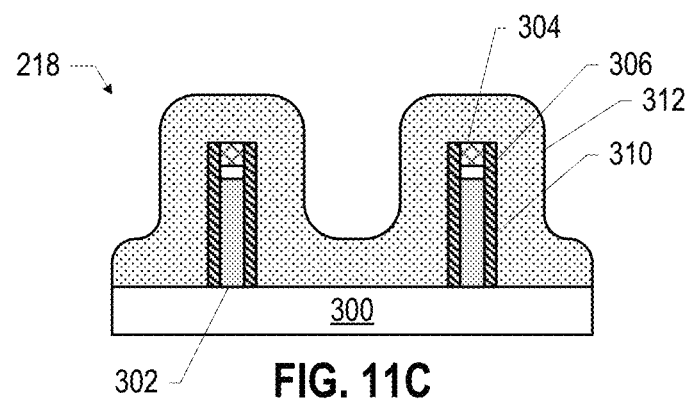

FIG. 11 illustrates an assembly 218 subsequent to removing the additional protective material 313 from the assembly 216 (FIG. 10). Any suitable technique may be used to remove the additional protective material 313, such as an appropriate selective etch.

Figure 12A:
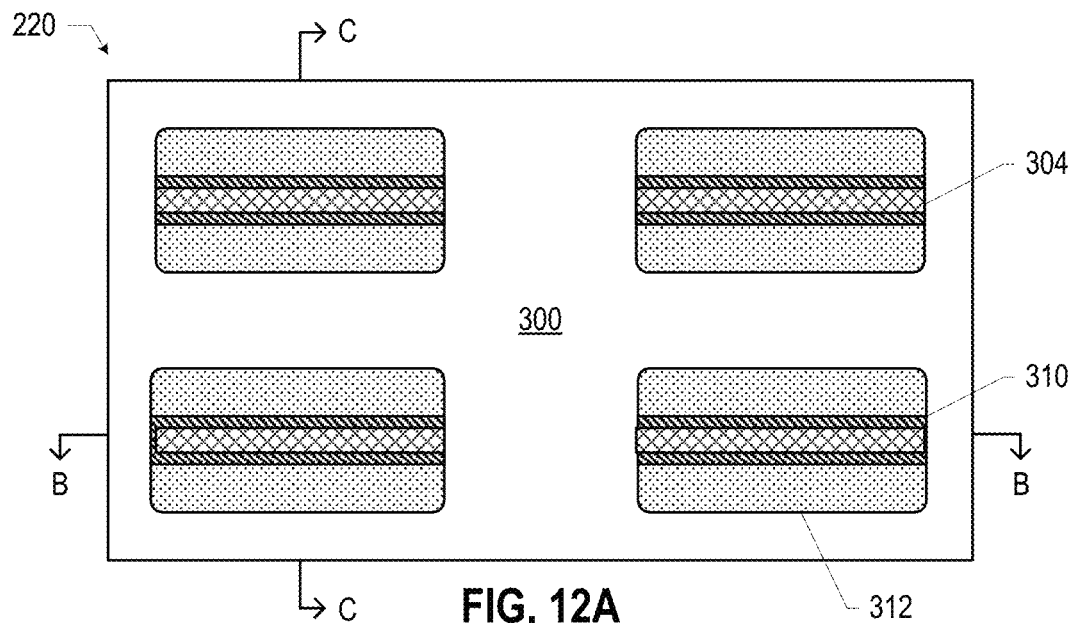
Figure 12B:
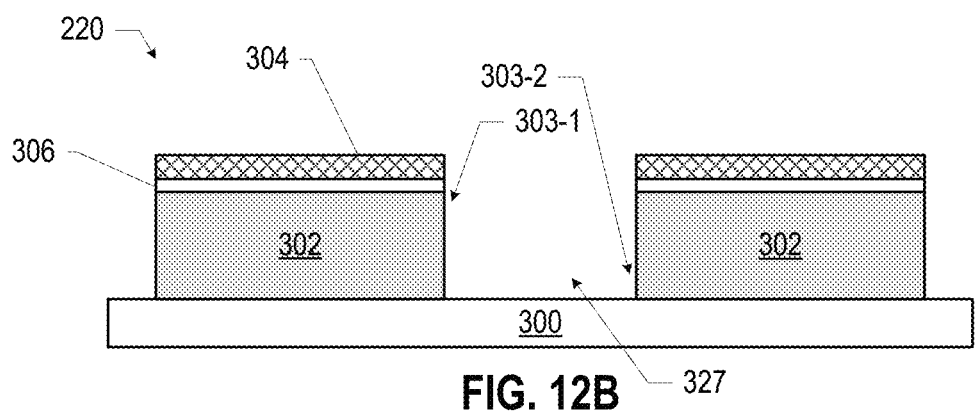
Figure 12C:
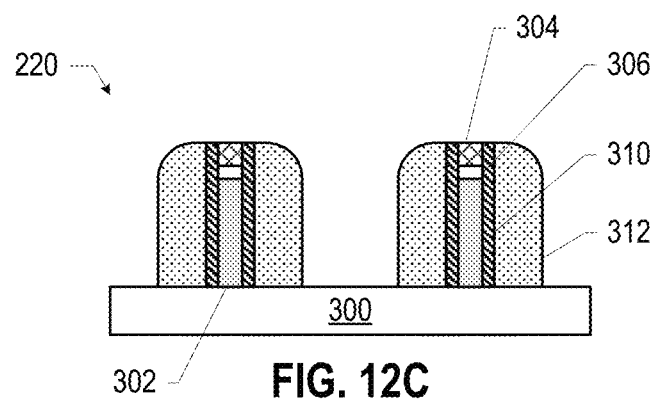

FIG. 12 illustrates an assembly 220 subsequent to "downwardly" etching the spacer material 312 of the assembly 218 (FIG. 11). This downward etching may substantially remove the spacer material 312 on "horizontal" surfaces of the assembly 216, while leaving spacer material 312 on "vertical" surfaces of the assembly 216, as known in the art. In particular, as illustrated in FIG. 12, the spacer material 312 may remain proximate to side faces of the fins 302, but little to no spacer material 312 may remain on the fin end caps 303 due to the previous processing.

Figure 13A:
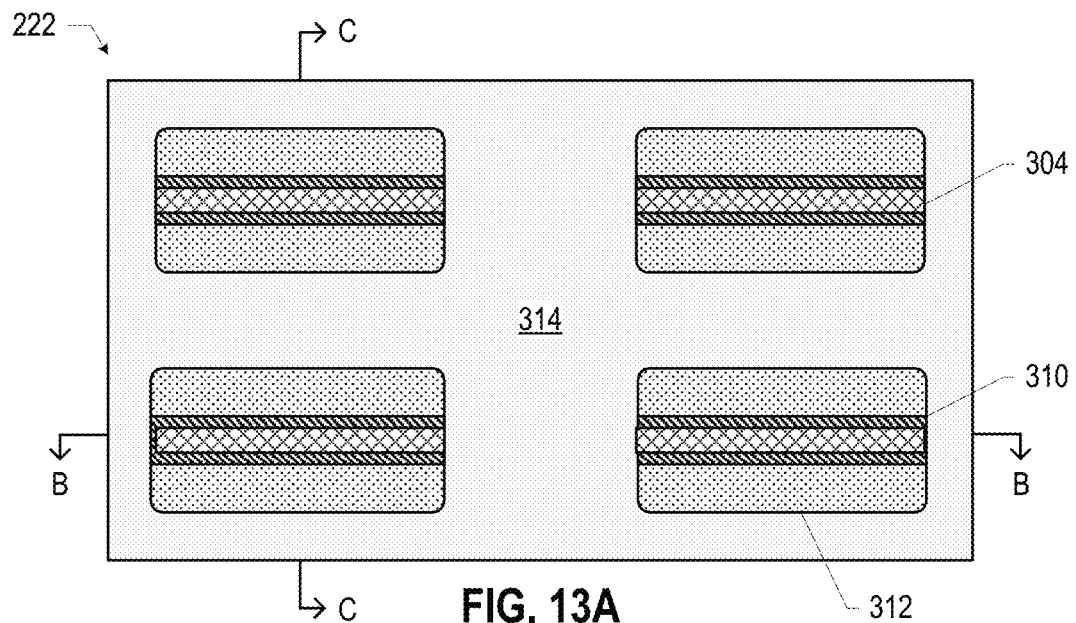
Figure 13B:
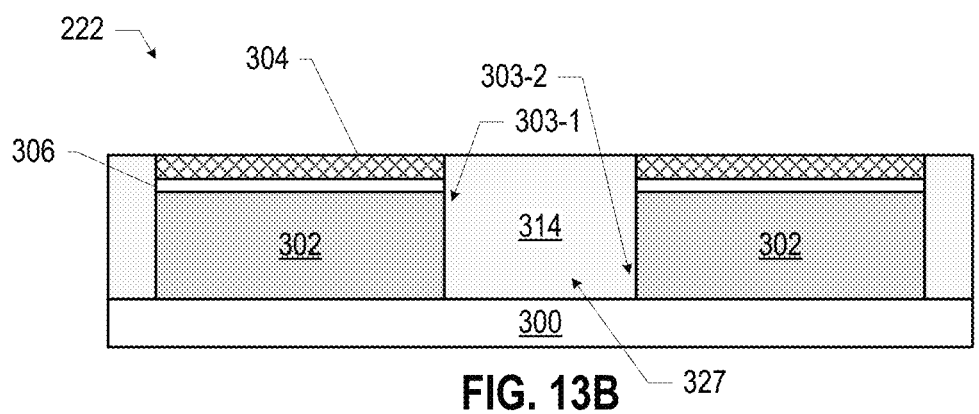
Figure 13C:
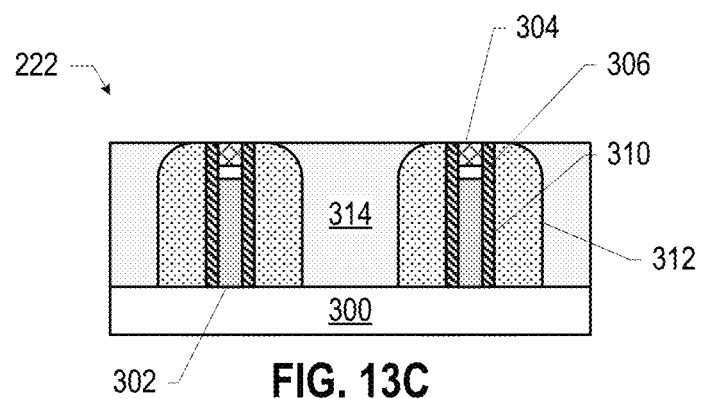

FIG. 13 illustrates an assembly 222 subsequent to depositing a gate edge isolation material 314 on the assembly 220 (FIG. 12). As noted above, the gate edge isolation material 314 may include any suitable dielectric material(s), and may be deposited using any suitable technique. In some embodiments, the assembly 222 may be planarized (e.g., using a chemical mechanical polishing technique) subsequent to deposition of the gate edge isolation material 314.

Figure 14A:
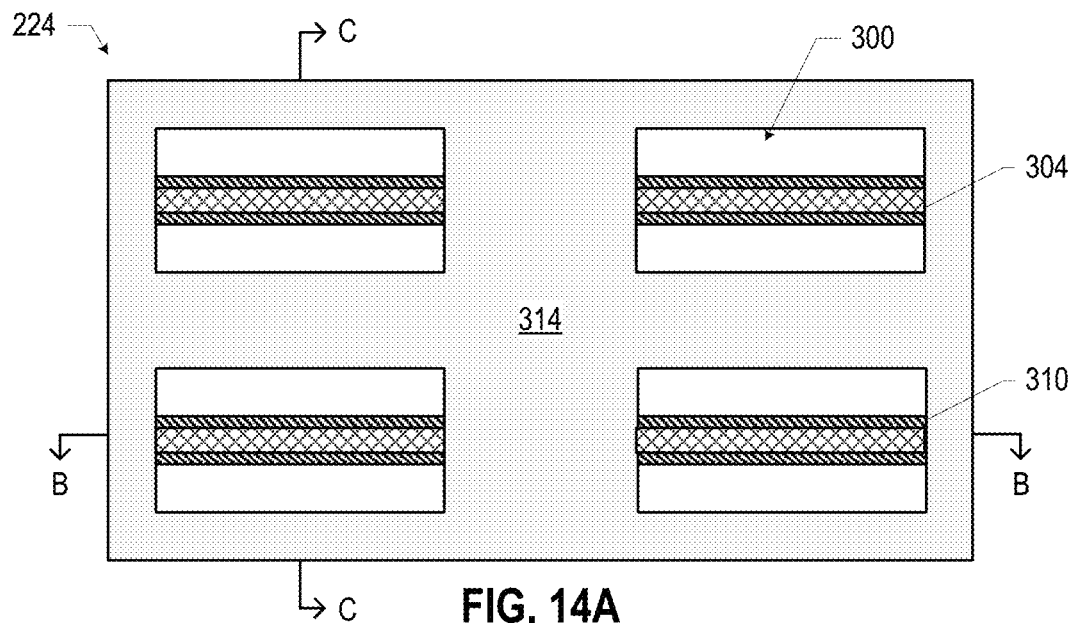
Figure 14B:
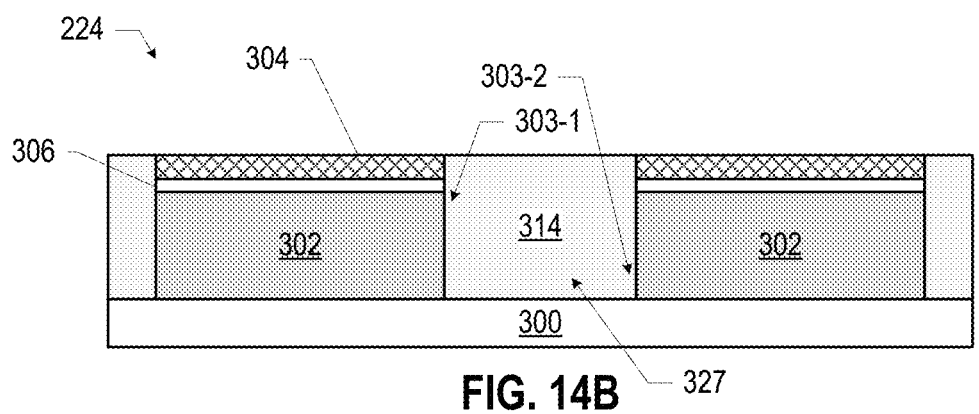
Figure 14C:
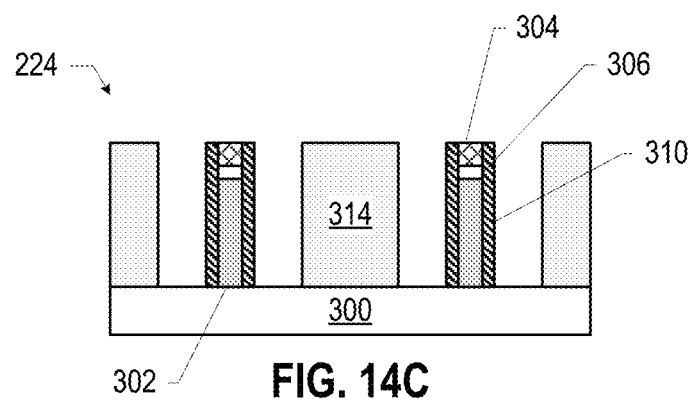

FIG. 14 illustrates an assembly 224 subsequent to removing the spacer material 312 from the assembly 222 (FIG. 13). Any suitable etch technique may be used to selectively remove the spacer material 312.

Figure 15A:
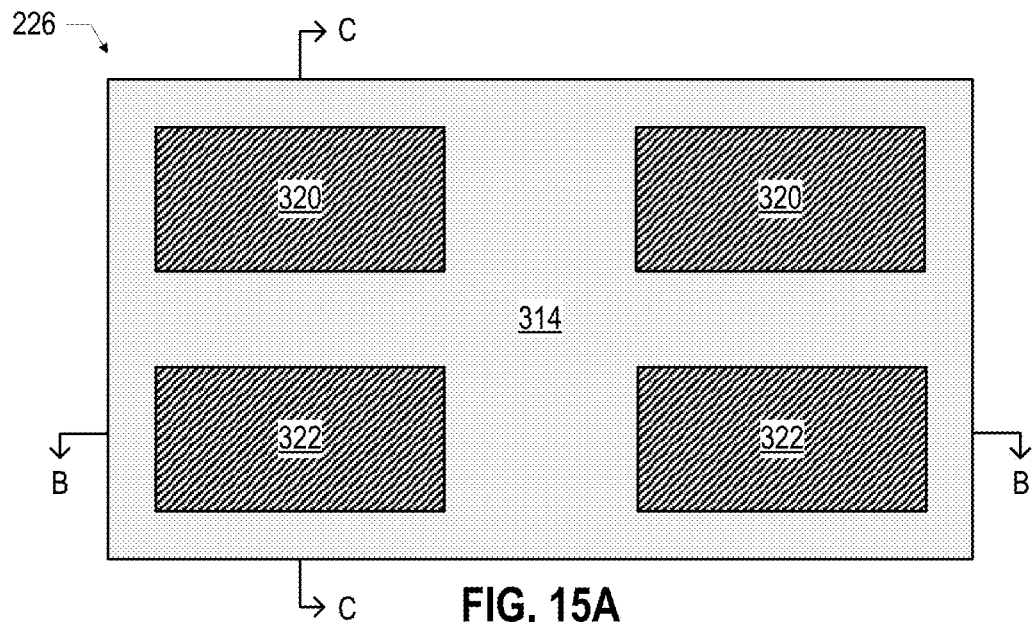
Figure 15B:
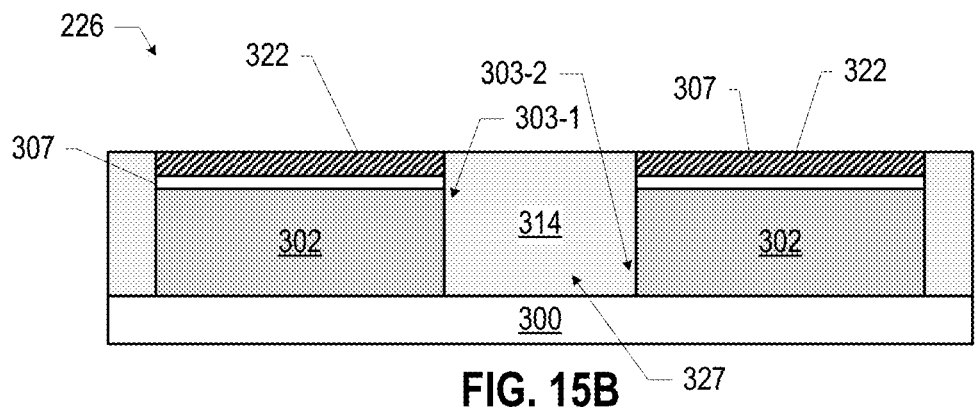
Figure 15C:
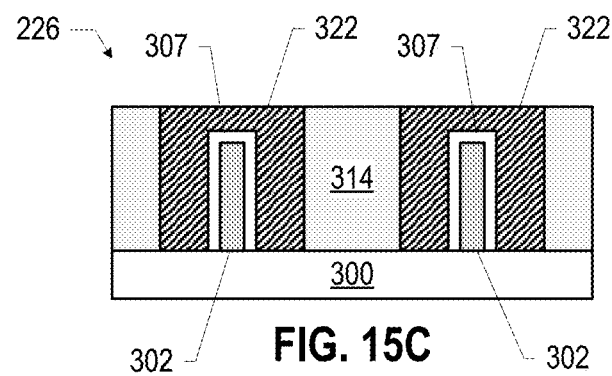

FIG. 15 illustrates an assembly 226 subsequent to removing the dielectric material 310, the pad oxide layer 306, and the hardmask layer 304 from the assembly 224 (FIG. 14), and conformally depositing a "permanent" gate dielectric 307 on the fins 302, followed by depositing material for the gate electrodes 322. Different ones of the gate electrodes 322 in the assembly 226 (and in the IC structure 100) may have different conductivity types (e.g., n-type or p-type), as desired. In embodiments in which the dielectric material 310 is not a dummy material, but is permanent, the dielectric material 310 may not be replaced in the assembly 226. The gate edge isolation material 314 may define the lateral extent of the gate electrodes 322 relative to the underlying fins 302, and as discussed above, may provide isolation between laterally adjacent gate electrodes 322.

Figure 16A:
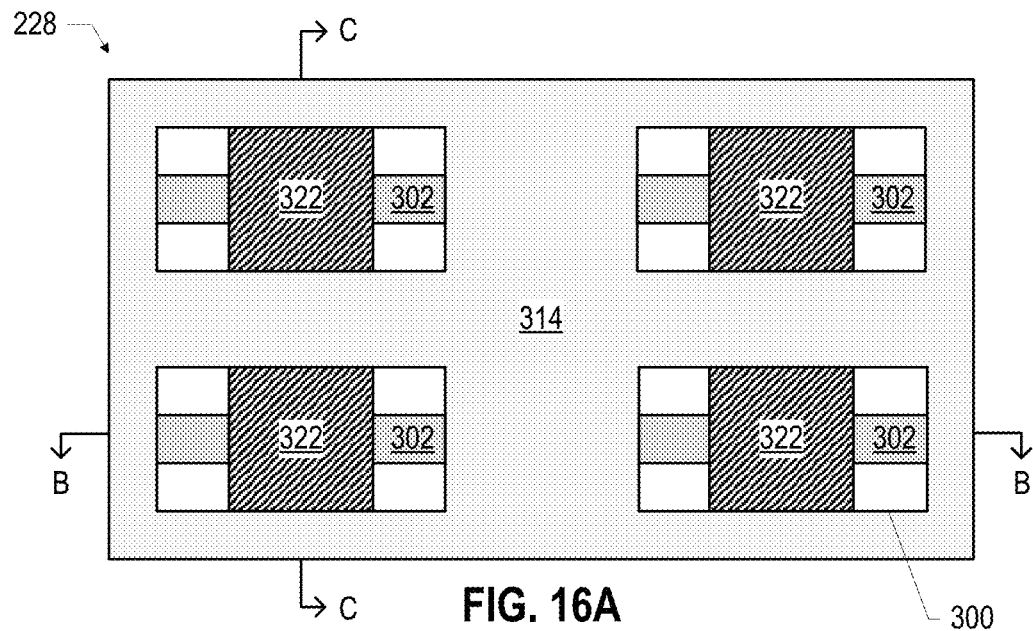
Figure 16B:
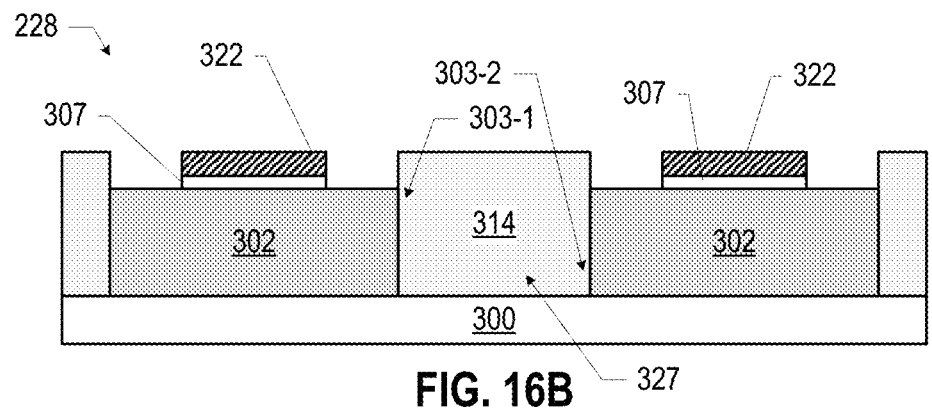
Figure 16C:
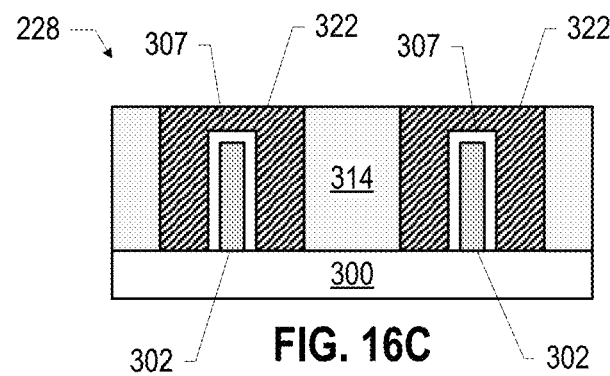

FIG. 16 illustrates an assembly 228 subsequent to patterning the gate dielectric 307 and the gate electrodes 322 of the assembly 226 (FIG. 15) to expose portions of the fins 302 proximate to the fin end caps 303. Any suitable patterning technique may be used the selectively remove the gate dielectric 307 and the gate electrodes 322 in these regions.

Figure 17A:
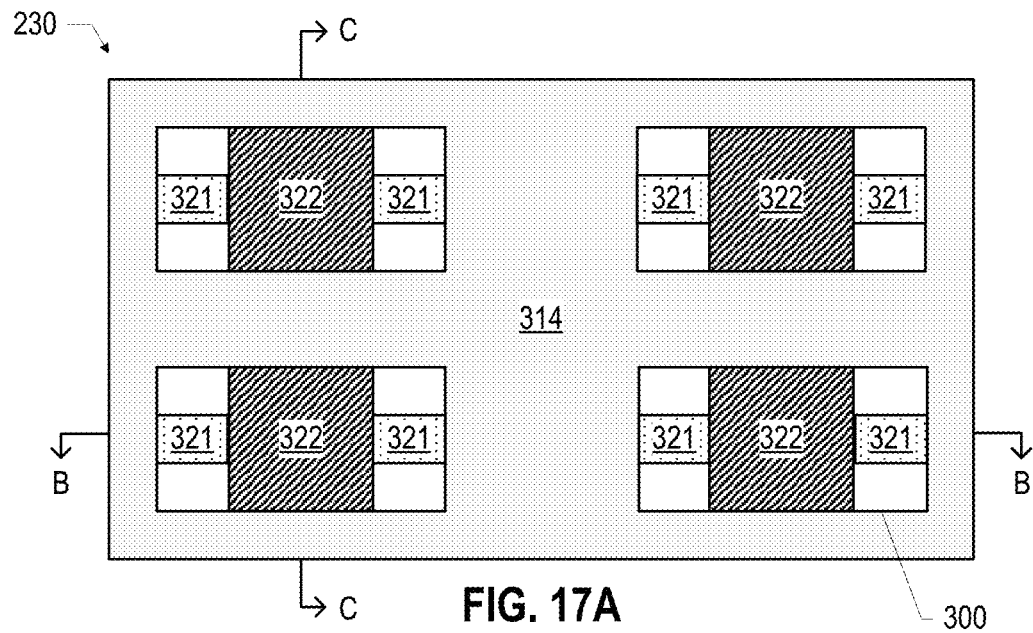
Figure 17B:
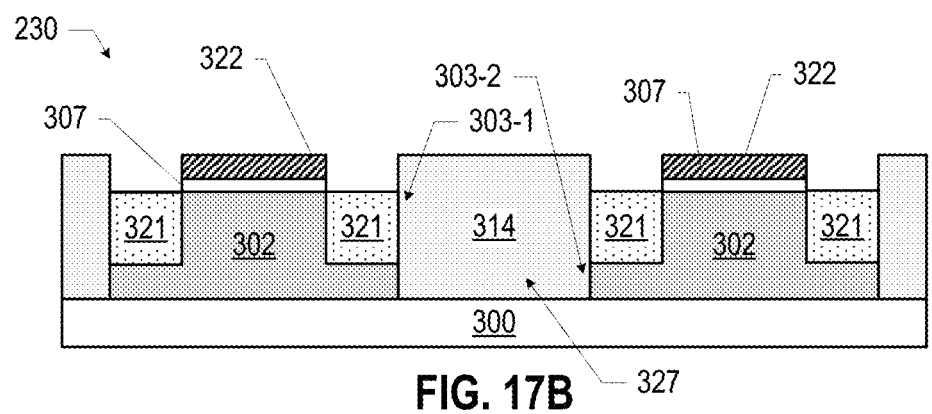
Figure 17C:
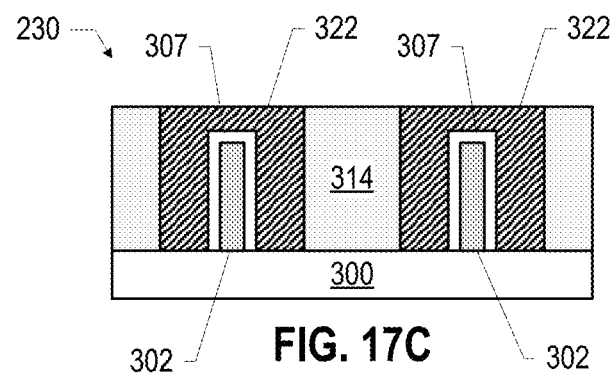

FIG. 17 illustrates an assembly 230 subsequent to forming S/D regions 321 in the portions of the fin 302 that were exposed in the assembly 228 (FIG. 16). In some embodiments, the S/D regions 321 may be formed using an implantation/diffusion process or an etching/deposition process, for example. In the former process, dopants such as boron, aluminum, antimony, phosphorous, or arsenic may be ion-implanted into the fins 302 to form the S/D regions 321. An annealing process that activates the dopants and causes them to diffuse farther into the fins 302 may follow the ion-implantation process. In the latter process, the fins 302 may first be etched to form recesses at the locations of the S/D regions 321. An epitaxial deposition process may then be carried out to fill the recesses with material that provides the S/D regions 321. In some implementations, the S/D regions 321 may be fabricated using a silicon alloy such as silicon germanium or silicon carbide. In some embodiments, the epitaxially deposited silicon alloy may be doped in situ with dopants such as boron, arsenic, or phosphorous. The assembly 230 may take the form of the IC structure 100 of FIG. 1. Further processing may be performed on the assembly 230, such as the deposition of an interlayer dielectric (not shown) and formation of electrical contacts (not shown) to the gates 308 and the S/D regions 321.

Figure 18:
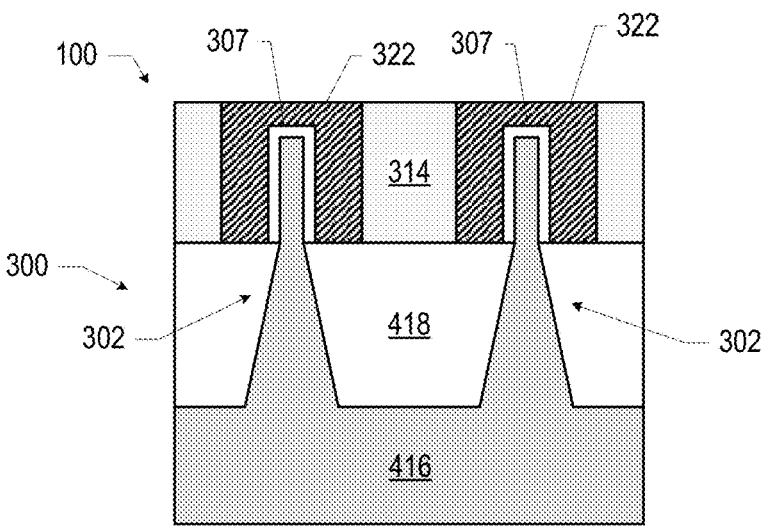
FIGS. 18-22 illustrate various features that may be part of the IC structure of FIG. 1, in accordance with various embodiments.
Figure 19:
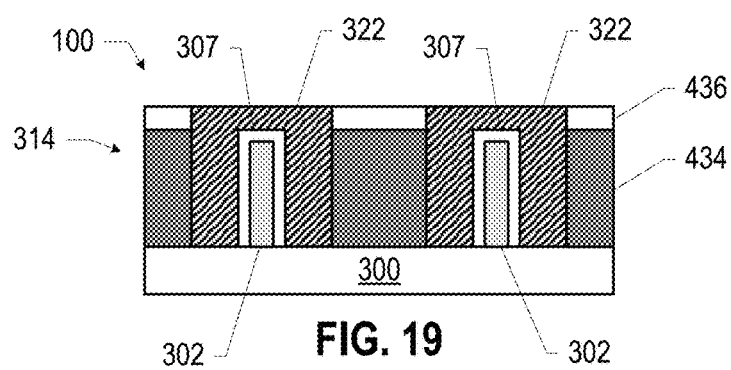
Figure 20:
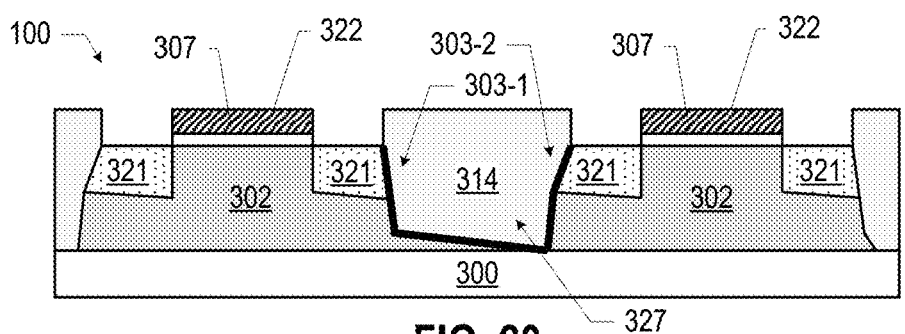

FIGS. 18-22 illustrate additional example features that may be included in an IC structure 100, in accordance with various embodiments. Any of the features discussed with reference to any of FIGS. 1 and 18-22 herein may be combined with any other features in an IC structure 100. For example, as discussed further below, FIG. 19 illustrates an embodiment in which the gate edge isolation material 314 includes multiple material layers, and FIG. 20 illustrates an embodiment in which the profiles of the fin end caps 303 defining a fin end gap 327 are different. These features of FIGS. 19 and 20 may both be exhibited in an IC structure 100 so that the IC structure 100, in accordance with the present disclosure, has a gate edge isolation material 314 that includes multiple material layers, and the profiles of the fin end caps 303 defining a fin end gap 327 are different. This particular combination is simply an example, and any combination may be used. A number of elements of FIGS. 18-22 are shared with FIGS. 1-17; for ease of discussion, a description of these elements is not repeated, and these elements may take the form of any of the embodiments disclosed herein.

As noted above, the base 300 may take any suitable form. For example, in some embodiments, the base 300 may include a bulk single crystalline substrate, and the fins 302 may be formed directly from the bulk substrate (e.g., so as to be continuous with the bulk substrate). FIG. 18 is a side cross-sectional view (sharing the perspective of FIG. 1C) of an IC structure 100 whose base 300 includes a substrate 416 and an STI layer 418. The fins 302 discussed above may be the upper portions of "taller" fins that are materially contiguous with the substrate 416 and are spaced apart at their base by the STI layer 418. In some embodiments, the substrate 416 may be a semiconductor substrate composed of semiconductor material systems including, for example, n-type or p-type materials systems (or a combination of both). The substrate 416 may include, for example, a crystalline substrate formed using a bulk silicon or an SOI substructure. In some embodiments, the substrate 416 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 416.

As noted above, in some embodiments, the gate edge isolation material 314 may include multiple different materials. For example, FIG. 19 illustrates an embodiment of an IC structure 100 (sharing the perspective of FIG. 1C) in which the gate edge isolation material 314 includes a lower dielectric material 434 and a different upper dielectric material 436. The lower dielectric material 434 and the upper dielectric material 436 may have any suitable material composition. For example, in some embodiments, the lower dielectric material 434 may be silicon nitride, and the upper dielectric material 436 may be a metal oxide (e.g., hafnium oxide).

In some embodiments, the two different phases of removal of the spacer material 312 on the fin end caps 303 (represented by FIGS. 4-7 and FIGS. 8-11, respectively) may degrade the underlying fins 302 and result in an asymmetry in the profile of the fin end caps 303 defining a fin end gap 327. For example, FIG. 20 illustrates an embodiment of an IC structure 100 (sharing the perspective of FIG. 1B) in which the profiles (emphasized with a bold line) of the fin end caps 303-1 and 303-2 defining a fin end gap 327 are different due to the different rounds of processing performed on each fin end cap 303. The profiles of the fin end caps 303-1 and 303-2 may differ in their slope or curvature, for example. In some embodiments, the surface IC structure between the fin end caps 303-1 and 303-2 may not be entirely "flat," but may have some non-zero slope (e.g., as shown in FIG. 20) as a consequence of the different rounds of processing performed on each fin end cap 303.

Figure 21:
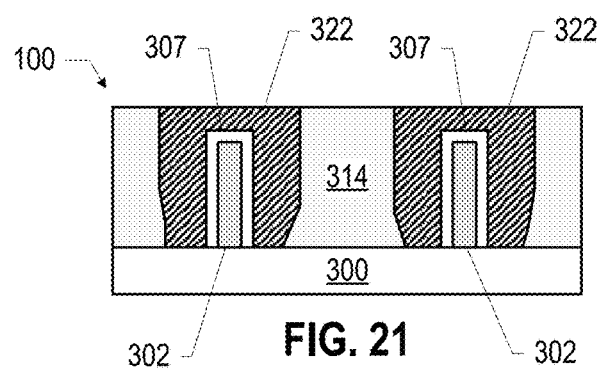

In some embodiments, the processing operations discussed above with reference to FIGS. 2-13 may result in a thinning of the spacer material 312 proximate to the bottoms of the fins 302. Thus, in some embodiments, the gate electrodes 322 may themselves be "thinner" proximate to the bottoms of the fins 302, and the gate edge isolation material 314 in a gate end gap 329 may subsequently be "fatter" proximate to the bottoms of the fins 302. FIG. 21 illustrates an example of an IC structure 100 exhibiting such features (sharing the perspective of FIG. 1C).

Figure 22:
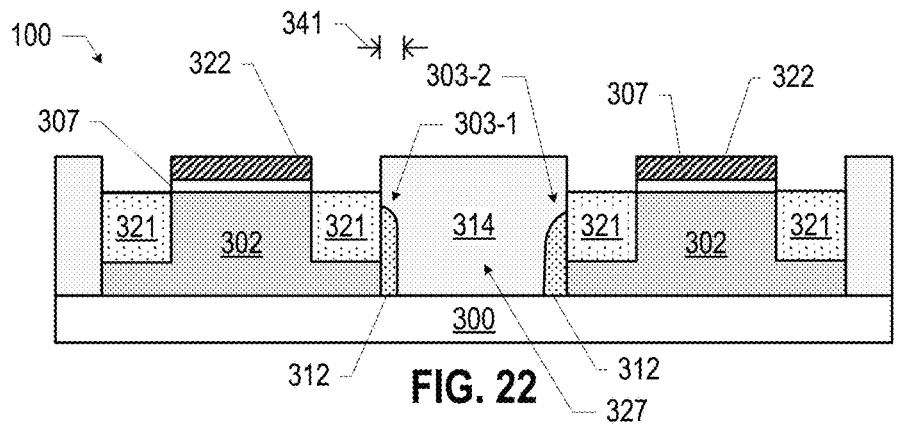

As noted above, in some embodiments, not all of the spacer material 312 may be removed from the fin end caps 303. FIG. 22 illustrates an example of an IC structure 100 (sharing the perspective of FIG. 1B) including some spacer material 312 remaining proximate to the fin end caps 303. In some embodiments, the thickness 341 of the spacer material 312 remaining proximate to the fin end caps 303 may be less than 5 nanometers (e.g., between 0 nanometers and 2 nanometers, or between 0 nanometers and 3 nanometers). In some embodiments, the thickness 341 of the spacer material 312 remaining on proximate to the fin end caps 303 may be less than half the thickness 350 (FIG. 1A) of the gate 308 on one side of the associated fin 302.

Figure 23:
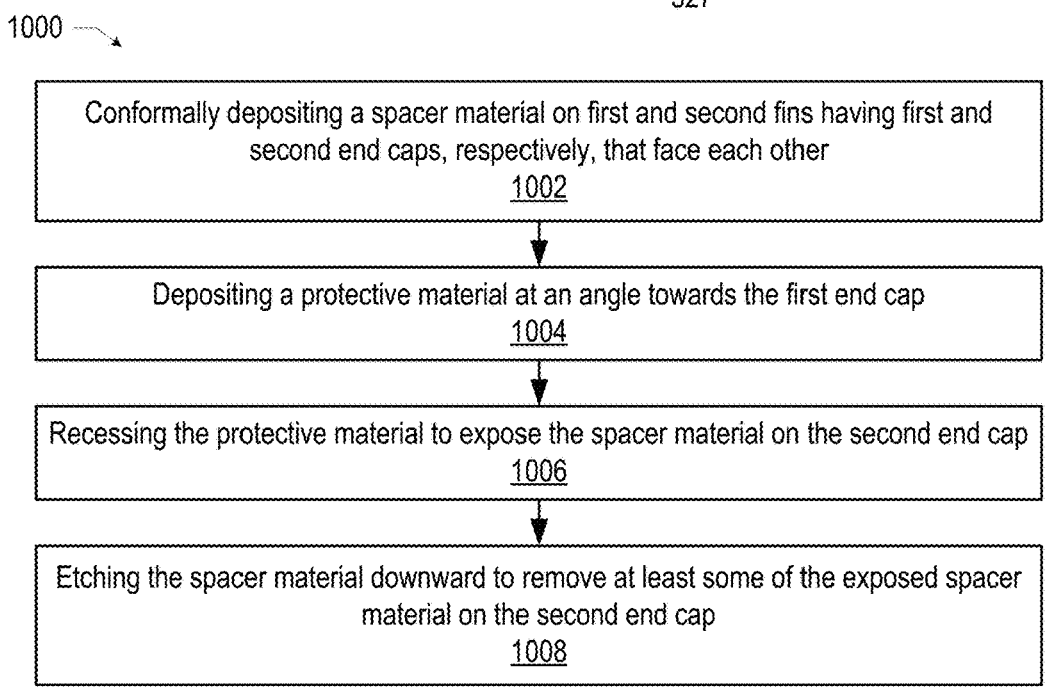
FIG. 23 is a flow diagram of a method of manufacturing an IC structure, in accordance with various embodiments.

FIG. 23 is a flow diagram of a method 1000 of manufacturing an IC structure in accordance with various embodiments. Although the operations of the method 1000 may be illustrated with reference to particular embodiments of the IC structures 100 disclosed herein, the method 1000 may be used to form any suitable IC structure. Operations are illustrated once each and in a particular order in FIG. 23, but the operations may be reordered and/or repeated as desired (e.g., with different operations performed in parallel when manufacturing multiple electronic components simultaneously).

At 1002, a spacer material may be conformally deposited on first and second fins. The first fin may have a first end that faces a second end of the second fin. For example, a spacer material 312 may be conformally deposited on two longitudinally aligned fins 302. A left fin end cap 303-1 of one of the fins 302 may face a right fin end cap 303-2 of the other of the fins 302 (e.g., as discussed above with reference to FIG. 3).

At 1004, a protective material may be deposited towards the first end at an angle. For example, a protective material 313 may be deposited at an angle towards the left fin end cap 303-1 (e.g., as discussed above with reference to FIG. 8).

At 1006, the protective material may be recessed to expose the spacer material on the second end. For example, the protective material 313 may be recessed to expose the spacer material 312 on the right fin end cap 303-2 (e.g., as discussed above with reference to FIG. 9).

At 1008, the spacer material may be etched downward to remove at least some of the exposed spacer material on the second end. For example, the spacer material 312 may be etched downward to remove at least some of the exposed spacer material 312 on the second fin end cap 303-2 (e.g., as discussed above with reference to FIG. 10).

The IC structures 100 disclosed herein may be included in any suitable electronic component. FIGS. 24-28 illustrate various examples of apparatuses that may include any of the IC structures 100 disclosed herein.

Figure 24:
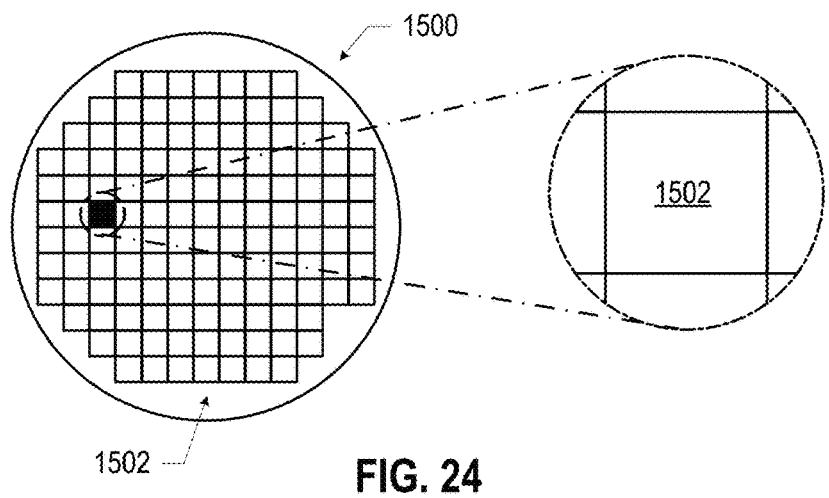
FIG. 24 is a top view of a wafer and dies that may include an IC structure in accordance with any of the embodiments disclosed herein.

FIG. 24 is a top view of a wafer 1500 and dies 1502 that may include one or more IC structures 100 in accordance with any of the embodiments disclosed herein. The wafer 1500 may be composed of semiconductor material and may include one or more dies 1502 having IC structures (e.g., IC structures 100) formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more IC structures 100 (e.g., as part of one or more transistors, such as some of the transistors 315 of FIG. 25, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 28) or other logic that is configured to store information in the memory devices or execute instructions stored in the memory array.

Figure 25:
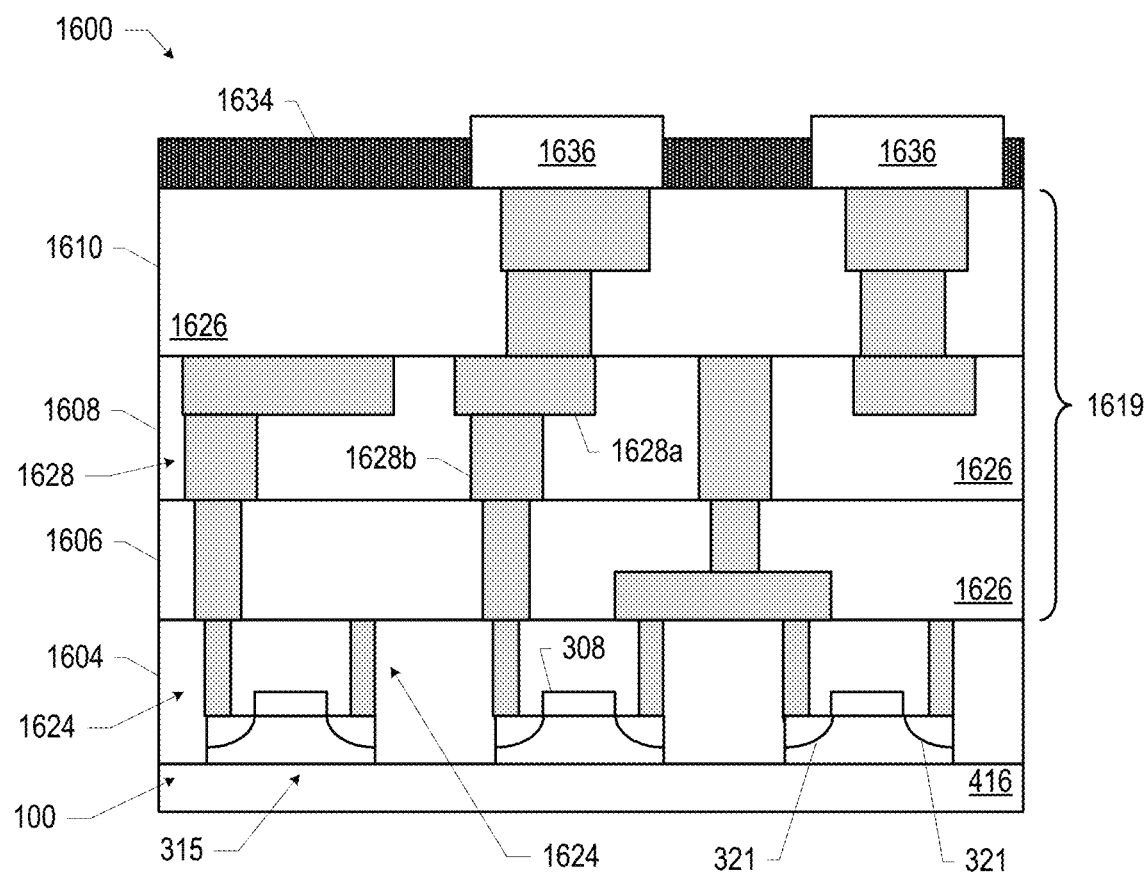
FIG. 25 is a cross-sectional side view of an IC device that may include an IC structure in accordance with any of the embodiments disclosed herein.

FIG. 25 is a cross-sectional side view of an IC device 1600 that may include one or more IC structures 100 in accordance with any of the embodiments disclosed herein. One or more of the IC devices 1600 may be included in one or more dies 1502 (FIG. 24). The IC device 1600 may be formed on a substrate 416 (e.g., the wafer 1500 of FIG. 24) and may be included in a die (e.g., the die 1502 of FIG. 24). The substrate 416 of the IC device 1600 may take any of the forms disclosed herein. Although a few examples of materials from which the substrate 416 may be formed are described herein, any material that may serve as a foundation for an IC device 1600 may be used. The substrate 416 may be part of a singulated die (e.g., the dies 1502 of FIG. 24) or a wafer (e.g., the wafer 1500 of FIG. 24).

As noted above, the IC device 1600 may include one or more device layers 1604 disposed on the substrate 416. The device layer 1604 may include features of one or more transistors 315 (e.g., metal oxide semiconductor field-effect transistors (MOSFETs)) formed on the substrate 416. In some embodiments, the transistors 315 may take any of the forms discussed above with reference to FIG. 1. The transistors 315 are not limited to the type and configuration depicted in FIG. 25 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

In some embodiments, the device layer 1604 may include one or more IC structures 100 (e.g., including the transistors 315). FIG. 25 illustrates a certain number of transistors 315 in the device layer 1604 for illustration purposes, but any number and structure of transistors 315 may be included in a device layer 1604. An IC structure 100 included in a device layer 1604 may be referred to as a "front-end" structure. In some embodiments, the IC device 1600 may not include any front-end IC structures 100. One or more IC structures 100 (e.g., one or more transistors 315) in the device layer 1604 may be coupled to any suitable other ones of the devices in the device layer 1604, to any devices in the metallization stack 1619 (discussed below), and/or to one or more of the conductive contacts 1636 (discussed below).

Electrical signals, such as power and/or input/output (I/O) signals, may be routed to and/or from the devices (e.g., transistors 315 of the IC structure 100) of the device layer 1604 through one or more interconnect layers disposed on the device layer 1604 (illustrated in FIG. 25 as interconnect layers 1606-1610). For example, electrically conductive features of the device layer 1604 (e.g., the gate 308 and the S/D contacts 1624) may be electrically coupled with the interconnect structures 1628 of the interconnect layers 1606-1610. The one or more interconnect layers 1606-1610 may form a metallization stack (also referred to as an "interlayer dielectric (ILD) stack") 1619 of the IC device 1600. In some embodiments, one or more IC structures 100 may be disposed in one or more of the interconnect layers 1606-1610, in accordance with any of the techniques disclosed herein. FIG. 25 does not illustrate any IC structures 100 in the metallization stack 1619 for ease of illustration, but any number and arrangement of IC structures 100 may be included in any one or more of the layers in a metallization stack 1619. An IC structure 100 included in the metallization stack 1619 may be referred to as a "back-end" structure. In some embodiments, the IC device 1600 may not include any back-end IC structures 100; in some embodiments, the IC device 1600 may include both front- and back-end IC structures 100. One or more IC structures 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 25). Although a particular number of interconnect layers 1606-1610 is depicted in FIG. 25, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 416 upon which the device layer 1604 is formed. For example, the lines 1628a may route electrical signals in a direction in and out of the page from the perspective of FIG. 25. The vias 1628b may be arranged to route electrical signals in a direction of a plane that is substantially perpendicular to the surface of the substrate 416 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 25. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 25, the conductive contacts 1636 are illustrated as taking the form of bond pads. The conductive contacts 1636 may be electrically coupled with the interconnect structures 1628 and configured to route the electrical signals of the transistor(s) 315 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 26:
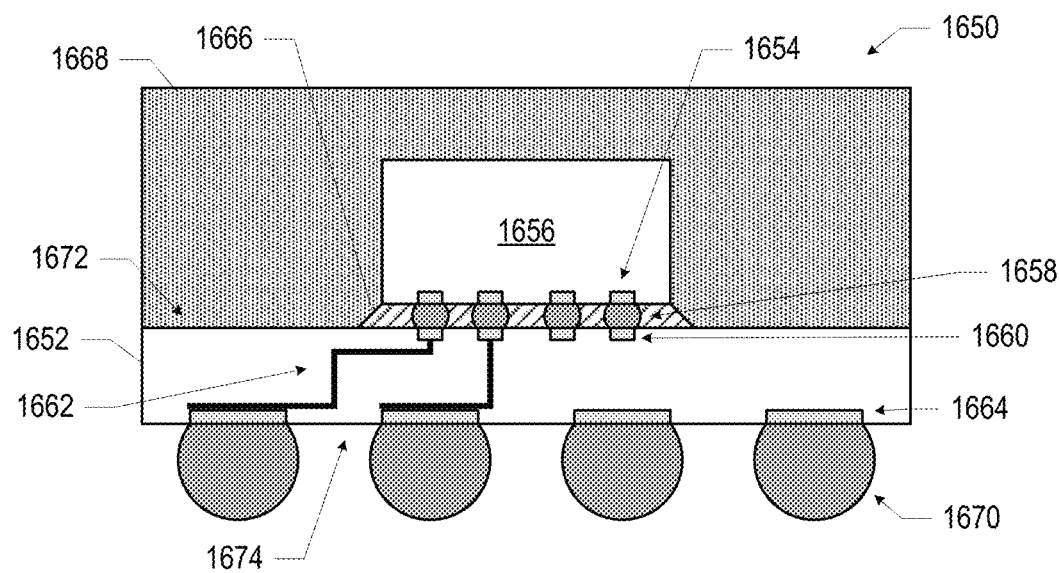
FIG. 26 is a cross-sectional side view of an IC package that may include an IC structure in accordance with various embodiments.

FIG. 26 is a cross-sectional view of an example IC package 1650 that may include a die 1656 having one or more IC structures 100 therein (e.g., as discussed above with reference to FIG. 24 and FIG. 25). The package substrate 1652 may be formed of a dielectric material, and may have conductive pathways extending through the dielectric material between the face 1672 and the face 1674, or between different locations on the face 1672, and/or between different locations on the face 1674. These conductive pathways may take the form of any of the interconnect structures 1628 discussed above with reference to FIG. 25.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 or to any devices included in the package substrate 1652, not shown. The first-level interconnects 1658 illustrated in FIG. 26 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 26 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 27.

Although the IC package 1650 illustrated in FIG. 26 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 26, an IC package 1650 may include multiple dies 1656 (e.g., with one or more of the multiple dies 1656 including an IC structure 100). An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 27:
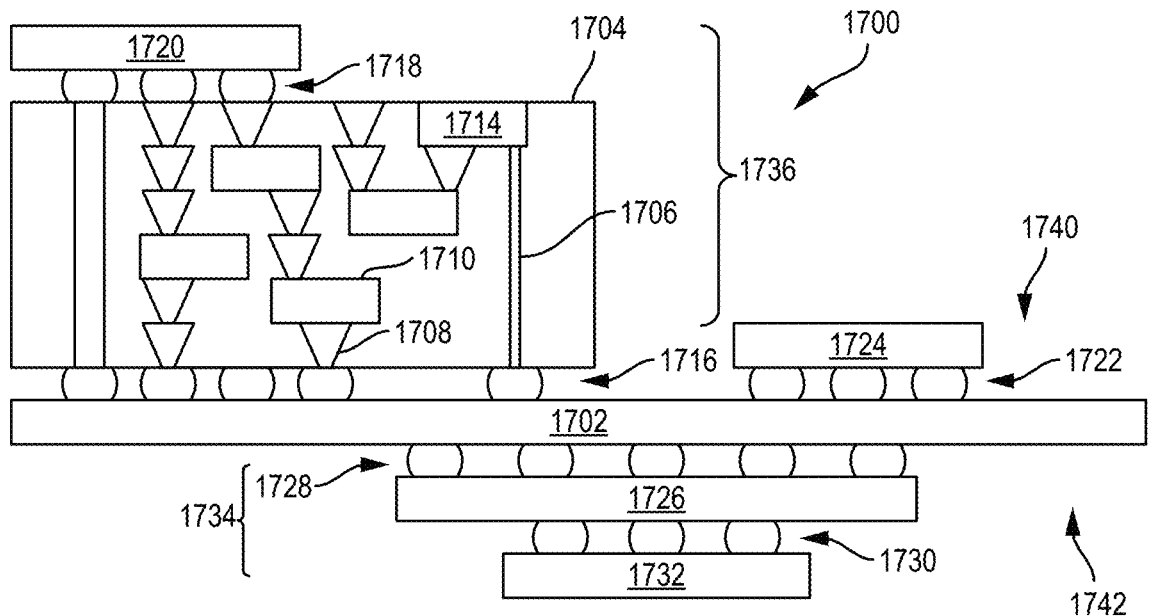
FIG. 27 is a cross-sectional side view of an IC device assembly that may include an IC structure in accordance with any of the embodiments disclosed herein.

FIG. 27 is a cross-sectional side view of an IC device assembly 1700 that may include one or more IC packages or other electronic components (e.g., a die) including one or more IC structures 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 26 (e.g., may include one or more IC structures 100 in a die).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 27 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 27), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 27, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 24), an IC device (e.g., the IC device 1600 of FIG. 25), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 27, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 27 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 28:
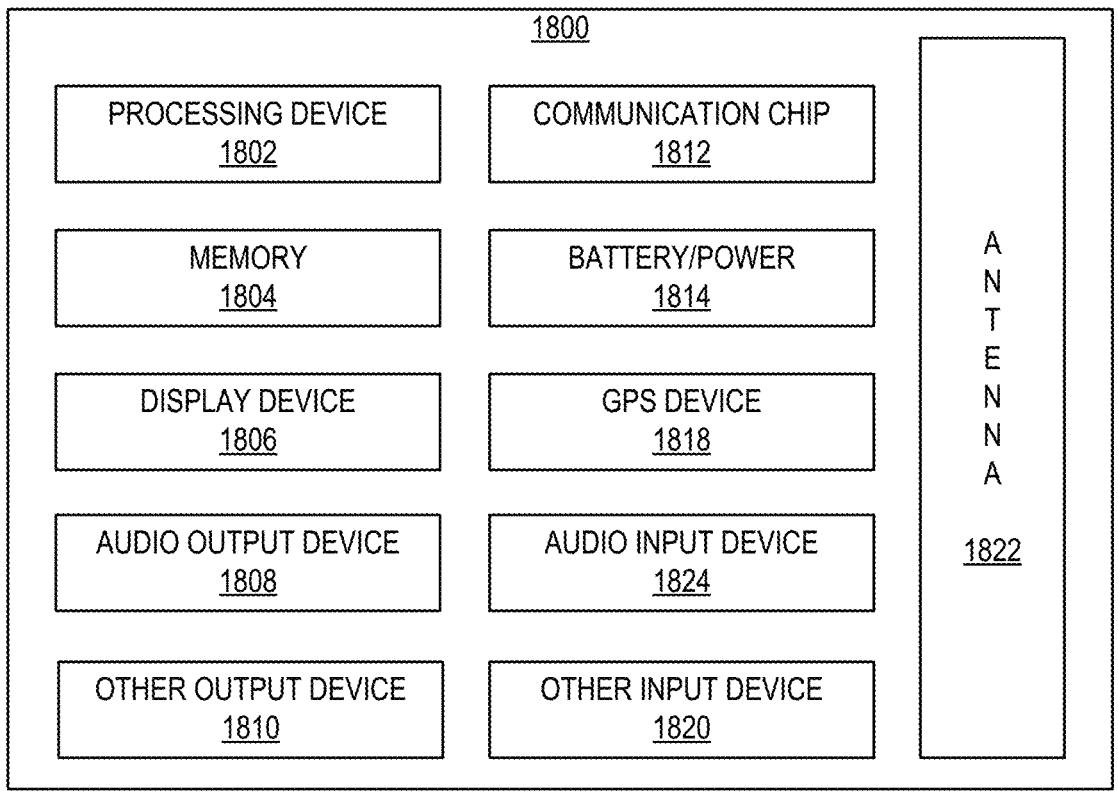
FIG. 28 is a block diagram of an example electrical device that may include an IC structure in accordance with any of the embodiments disclosed herein.

FIG. 28 is a block diagram of an example electrical device 1800 that may include one or more IC structures 100, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 28 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 28, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: a first semiconductor fin having a first fin end cap; a second semiconductor fin having a second fin end cap, wherein the second fin end cap faces the first fin end cap; a first gate over the first semiconductor fin, wherein the first gate has a first gate end cap; a second gate over the second semiconductor fin, wherein the second gate has a second gate end cap facing the first gate end cap; and a gate edge isolation material adjacent to the first fin end cap, the second fin end cap, the first gate end cap, and the second gate end cap.

Example 2 may include the subject matter of Example 1, and may further specify that the first fin end cap and the second fin end cap have different profiles.

Example 3 may include the subject matter of any of Examples 1-2, and may further specify that the first gate is narrower towards a base of the first semiconductor fin than towards a top of the first semiconductor fin.

Example 4 may include the subject matter of any of Examples 1-3, and may further include spacer material proximate to a bottom of the first fin end cap.

Example 5 may include the subject matter of Example 4, and may further specify that the spacer material has a height that is less than 50 nanometers.

Example 6 may include the subject matter of any of Examples 4-5, and may further specify that the spacer material has a thickness that is less than 5 nanometers.

Example 7 may include the subject matter of any of Examples 4-6, and may further specify that the spacer material has a thickness that is less than half a thickness of the first gate on one side of the first semiconductor fin.

Example 8 may include the subject matter of any of Examples 4-7, and may further specify that the spacer material includes silicon and oxygen.

Example 9 may include the subject matter of any of Examples 1-8, and may further specify that the gate edge isolation material includes a lower dielectric material and a different upper dielectric material.

Example 10 is an integrated circuit (IC) structure, including: a first semiconductor fin having a first fin end cap; a second semiconductor fin having a second fin end cap, wherein the second fin end cap faces the first fin end cap, and the second fin end cap has a different profile than the first fin end cap; a first gate over the first semiconductor fin, wherein the first gate includes first gate end caps; a second gate over the second semiconductor fin, wherein the second gate includes second gate end caps; and a gate edge isolation material adjacent to the first gate end caps and the second gate end caps.

Example 11 may include the subject matter of Example 10, and may further specify that the gate edge isolation material includes silicon and nitrogen.

Example 12 may include the subject matter of any of Examples 10-11, and may further specify that the first gate is narrower towards a base of the first semiconductor fin than towards a top of the first semiconductor fin.

Example 13 may include the subject matter of any of Examples 10-12, and may further include:
spacer material proximate to a bottom of the first fin end cap.

Example 14 may include the subject matter of Example 13, and may further specify that the spacer material has a height that is less than 50 nanometers.

Example 15 may include the subject matter of any of Examples 13-14, and may further specify that the spacer material has a thickness that is less than 5 nanometers.

Example 16 may include the subject matter of any of Examples 13-15, and may further specify that the spacer material has a thickness that is less than half a thickness of the first gate on one side of the first semiconductor fin.

Example 17 is a method of manufacturing an integrated circuit (IC) structure, including: forming a first fin having a first end cap, wherein the first fin is substantially perpendicular to a substrate surface; forming a second fin having a second end cap, wherein the second fin is substantially perpendicular to the substrate surface, and the second fin end cap faces the first fin end cap; conformally depositing a spacer material, wherein the spacer material is deposited on side faces and end caps of the first fin and the second fin; depositing a protective material at an angle not perpendicular to the substrate surface, wherein the protective material deposits more thickly proximate to a top of the first end cap than proximate to a top of the second end cap; recessing the protective material to expose spacer material proximate to the top of the second end cap, wherein spacer material proximate to the top of the first end cap is covered with protective material after the recess; and after recessing the protective material, etching the spacer material in a direction perpendicular to the substrate surface, wherein etching the spacer material removes at least some of the spacer material on the second end cap.

Example 18 may include the subject matter of Example 17, and may further specify that the protective material includes titanium nitride.

Example 19 may include the subject matter of any of Examples 17-18, and may further specify that the spacer material is conformally deposited by atomic layer deposition.

Example 20 may include the subject matter of any of Examples 17-19, and may further specify that the protective material is deposited by sputtering.

Example 21 may include the subject matter of any of Examples 17-20, and may further specify that a distance between the first fin end cap and the second fin end cap is between 25 nanometers and 75 nanometers.

Example 22 may include the subject matter of any of Examples 17-21, and may further specify that directionally etching the spacer material removes at least half of a thickness of the spacer material on the second end cap.

Example 23 may include the subject matter of any of Examples 17-22, and may further specify that the angle is a first angle, and the method further includes: after etching the spacer material, removing the protective material; depositing additional protective material at a second angle not perpendicular to the substrate surface, wherein the additional protective material deposits more thickly proximate to the top of the second end cap than proximate to the top of the first end cap; recessing the additional protective material to expose spacer material proximate to the top of the first end cap, wherein the top of the second end cap is covered with the additional protective material after the recess; and after recessing the additional protective material, etching the spacer material in a direction perpendicular to the substrate surface, wherein etching the spacer material removes at least some of the spacer material on the first end cap.

Example 24 may include the subject matter of Example 23, and may further include: after etching the spacer material to remove at least some of the spacer material on the first end cap, removing the additional protective material; after removing the additional protective material, etching the remaining spacer material to form spacers on side faces of the first fin and the second fin; and after forming the spacers, depositing a gate edge isolation material.

Example 25 may include the subject matter of Example 24, and may further include: after depositing the gate edge isolation material, removing the spacers to form cavities; and forming gates in the cavities.

Example 26 is a computing device, including: a circuit board; and an integrated circuit (IC) package coupled to the circuit board, wherein the IC package includes a die, the die includes an IC structure, and the IC structure includes a first semiconductor fin having a first fin end cap, a second semiconductor fin having a second fin end cap, wherein the second fin end cap faces the first fin end cap, a first gate over the first semiconductor fin, wherein the first gate has a first gate end cap, a second gate over the second semiconductor fin, wherein the second gate has a second gate end cap facing the first gate end cap, and a gate edge isolation material adjacent to the first fin end cap, the second fin end cap, the first gate end cap, and the second gate end cap.

Example 27 may include the subject matter of Example 26, and may further include a wireless communication antenna coupled to the circuit board.

Example 28 may include the subject matter of any of Examples 26-27, and may further specify that the computing device is a handheld or wearable computing device.

The invention claimed is:

1. An integrated circuit (IC) structure, comprising:
a first semiconductor fin having a first fin end cap;
a second semiconductor fin having a second fin end cap, wherein the second fin end cap faces the first fin end cap;
a first gate over the first semiconductor fin, wherein the first gate has a first gate end cap;
a second gate over the second semiconductor fin, wherein the second gate has a second gate end cap facing the first gate end cap; and
a gate edge isolation material adjacent to the first fin end cap, the second fin end cap, the first gate end cap, and the second gate end cap.

2. The IC structure of claim 1, wherein the first fin end cap and the second fin end cap have different profiles.

3. The IC structure of claim 1, wherein the first gate is narrower towards a base of the first semiconductor fin than towards a top of the first semiconductor fin.

4. The IC structure of claim 1, further comprising:
spacer material proximate to a bottom of the first fin end cap.

5. The IC structure of claim 4, wherein the spacer material has a height that is less than 50 nanometers.

6. The IC structure of claim 4, wherein the spacer material has a thickness that is less than 5 nanometers.

7. The IC structure of claim 4, wherein the spacer material has a thickness that is less than half a thickness of the first gate on one side of the first semiconductor fin.

8. The IC structure of claim 4, wherein the spacer material includes silicon and oxygen.

9. The IC structure of claim 1, wherein the gate edge isolation material includes a lower dielectric material and a different upper dielectric material.

10. An integrated circuit (IC) structure, comprising:
a first semiconductor fin having a first fin end cap;
a second semiconductor fin having a second fin end cap, wherein the second fin end cap faces the first fin end cap, and the second fin end cap has a different profile than the first fin end cap;
a first gate over the first semiconductor fin, wherein the first gate includes first gate end caps;
a second gate over the second semiconductor fin, wherein the second gate includes second gate end caps; and
a gate edge isolation material adjacent to the first gate end caps and the second gate end caps.

11. The IC structure of claim 10, wherein the gate edge isolation material includes silicon and nitrogen.

12. The IC structure of claim 10, wherein the first gate is narrower towards a base of the first semiconductor fin than towards a top of the first semiconductor fin.

13. The IC structure of claim 10, further comprising:
spacer material proximate to a bottom of the first fin end cap.

14. The IC structure of claim 13, wherein the spacer material has a height that is less than 50 nanometers.

15. The IC structure of claim 13, wherein the spacer material has a thickness that is less than 5 nanometers.

16. The IC structure of claim 13, wherein the spacer material has a thickness that is less than half a thickness of the first gate on one side of the first semiconductor fin.

17. A computing device, comprising:
a circuit board; and
an integrated circuit (IC) package coupled to the circuit board, wherein the IC package includes a die, the die includes an IC structure, and the IC structure includes:
a first semiconductor fin having a first fin end cap,
a second semiconductor fin having a second fin end cap, wherein the second fin end cap faces the first fin end cap,
a first gate over the first semiconductor fin, wherein the first gate has a first gate end cap,
a second gate over the second semiconductor fin, wherein the second gate has a second gate end cap facing the first gate end cap, and
a gate edge isolation material adjacent to the first fin end cap, the second fin end cap, the first gate end cap, and the second gate end cap.

18. The computing device of claim 17, further comprising:
a wireless communication antenna coupled to the circuit board.

19. The computing device of claim 17, wherein the computing device is a handheld or wearable computing device.

* * * * *